US008648403B2

(12) United States Patent
Luk et al.

(10) Patent No.: US 8,648,403 B2
(45) Date of Patent: Feb. 11, 2014

(54) DYNAMIC MEMORY CELL STRUCTURES

(75) Inventors: Wing K. Luk, Chappaqua, NY (US); Jin Cai, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 1147 days.

(21) Appl. No.: 11/408,752

(22) Filed: Apr. 21, 2006

(65) Prior Publication Data

US 2007/0249115 A1   Oct. 25, 2007

(51) Int. Cl.
*H01L 27/108*   (2006.01)

(52) U.S. Cl.
USPC .............. 257/310; 257/296; 257/E27.084; 257/E21.645; 257/E21.646; 257/E21.647; 438/237

(58) Field of Classification Search
USPC ................... 257/296, E27.084, 310, 257/E21.645–E21.647; 438/239, 237
See application file for complete search history.

(56) References Cited

U.S. PATENT DOCUMENTS

| | | | |
|---|---|---|---|
| 3,387,286 A | 6/1968 | Dennard | 365/222 |
| 3,811,076 A * | 5/1974 | Smith, Jr. | 257/296 |
| 3,876,991 A * | 4/1975 | Nelson et al. | 365/178 |
| 4,417,325 A | 11/1983 | Harari | |
| 5,103,423 A * | 4/1992 | Miyazaki et al. | 365/189.11 |
| 5,133,060 A | 7/1992 | Weber et al. | |
| 5,675,160 A | 10/1997 | Oikawa | |
| 5,768,186 A | 6/1998 | Ma | 365/185.01 |
| 6,066,869 A * | 5/2000 | Noble et al. | 257/296 |
| 6,104,045 A * | 8/2000 | Forbes et al. | 257/141 |
| 6,211,548 B1 | 4/2001 | Ma | 257/321 |
| 6,475,874 B2 | 11/2002 | Xiang et al. | 438/396 |
| 6,573,134 B2 | 6/2003 | Ma et al. | 438/216 |
| 6,614,064 B1 | 9/2003 | Besser et al. | 257/213 |
| 6,664,589 B2 | 12/2003 | Forbes et al. | 257/328 |
| 6,750,066 B1 | 6/2004 | Cheung et al. | 438/3 |
| 6,916,698 B2 | 7/2005 | Mocuta et al. | 438/217 |
| 6,924,184 B2 | 8/2005 | Cave et al. | 438/201 |
| 7,027,326 B2 | 4/2006 | Luk et al. | 365/175 |
| 7,148,143 B2 | 12/2006 | Bu et al. | |

(Continued)

FOREIGN PATENT DOCUMENTS

| | | | |
|---|---|---|---|
| JP | 2054572 | A | 2/1990 |
| JP | 4357865 | A | 12/1992 |

(Continued)

OTHER PUBLICATIONS

Park et al., "Novel Damage-free Direct Metal Gate Process Using Atomic Layer Deposition," 4-89114-012-7/01, 2001 Symposium on VLSI Technology Digest of Technical Papers, pp. 65-66 (2001).

(Continued)

*Primary Examiner* — Kenneth Parker
*Assistant Examiner* — John Lin
(74) *Attorney, Agent, or Firm* — Jennifer R. Davis; Ryan, Mason & Lewis, LLP

(57) ABSTRACT

A dynamic random access memory cell is disclosed that comprises a capacitive storage device and a write access transistor. The write access transistor is operatively coupled to the capacitive storage device and has a gate stack that comprises a high-K dielectric, wherein the high-K dielectric has a dielectric constant greater than a dielectric constant of silicon dioxide. Also disclosed are a memory array using the cells, a computing apparatus using the memory array, a method of storing data, and a method of manufacturing.

21 Claims, 23 Drawing Sheets gd – GATED DIODE    wg – WRITE GATE
rg – READ GATE      rs – READ SELECT

(56) References Cited

U.S. PATENT DOCUMENTS

| | | |
|---|---|---|
| 7,411,236 B2 | 8/2008 | Matsuzawa |
| 2002/0045332 A1 | 4/2002 | Jang et al. |
| 2002/0192974 A1 | 12/2002 | Anh et al. |
| 2003/0042516 A1 | 3/2003 | Forbes et al. |
| 2003/0089942 A1* | 5/2003 | Bhattacharyya ............... 257/310 |
| 2004/0033701 A1 | 2/2004 | Ahn et al. |
| 2005/0128803 A1 | 6/2005 | Luk et al. ...................... 365/175 |
| 2005/0145895 A1 | 7/2005 | Luk et al. |
| 2005/0145959 A1 | 7/2005 | Forbes et al. |
| 2006/0014331 A1 | 1/2006 | Tang et al. |
| 2006/0057808 A1 | 3/2006 | Turkot et al. |
| 2006/0081948 A1 | 4/2006 | Lim et al. |

FOREIGN PATENT DOCUMENTS

| | | |
|---|---|---|
| JP | 5308132 A | 11/1993 |
| JP | H11238860 A | 8/1999 |
| JP | 2001127171 A | 5/2001 |
| JP | 2002100746 A | 4/2002 |
| JP | 2002522871 A | 7/2002 |
| JP | 2002352580 A | 12/2002 |
| JP | 2003037188 A | 2/2003 |
| JP | 2003332458 A | 11/2003 |
| JP | 2005051186 A | 2/2005 |
| JP | 2005123384 A | 5/2005 |
| JP | 2005175494 A | 6/2005 |
| JP | 2005222620 A | 8/2005 |
| JP | 2006012878 A | 1/2006 |
| WO | 02082554 A1 | 10/2002 |

OTHER PUBLICATIONS

Doris et al., "High Performance FDSOI CMOS Technology with Metal Gate and High-k," 4-900784-00-1, 2005 Symposium on VLSI Technology Digest of Technical Papers, pp. 214-215 (2005).

Hou et al., "Impact of Metal Gate Work Function on Nano CMOS Device Performance," 0-7803-8511-X, IEEE, pp. 57-60 (2004).

Zhu et al., "Schottky s/d MOSFETs with high-K gate dielectrics and metal gate electrodes," 0-7803-8511-X, IEEE, pp. 53-56 (2004).

Karp et al., "A 4096-bit dynamic MOS RAM," ISSCC Digest Technical Papers, pp. 10-11 (Feb. 1972).

Brian L. Ji, et al., "Multi-Port Dynamic Memory Structures" U.S. Appl. No. 11/623,434 (Jan. 16, 2007).

* cited by examiner

1T1D GATED DIODE GAIN CELL MEMORY

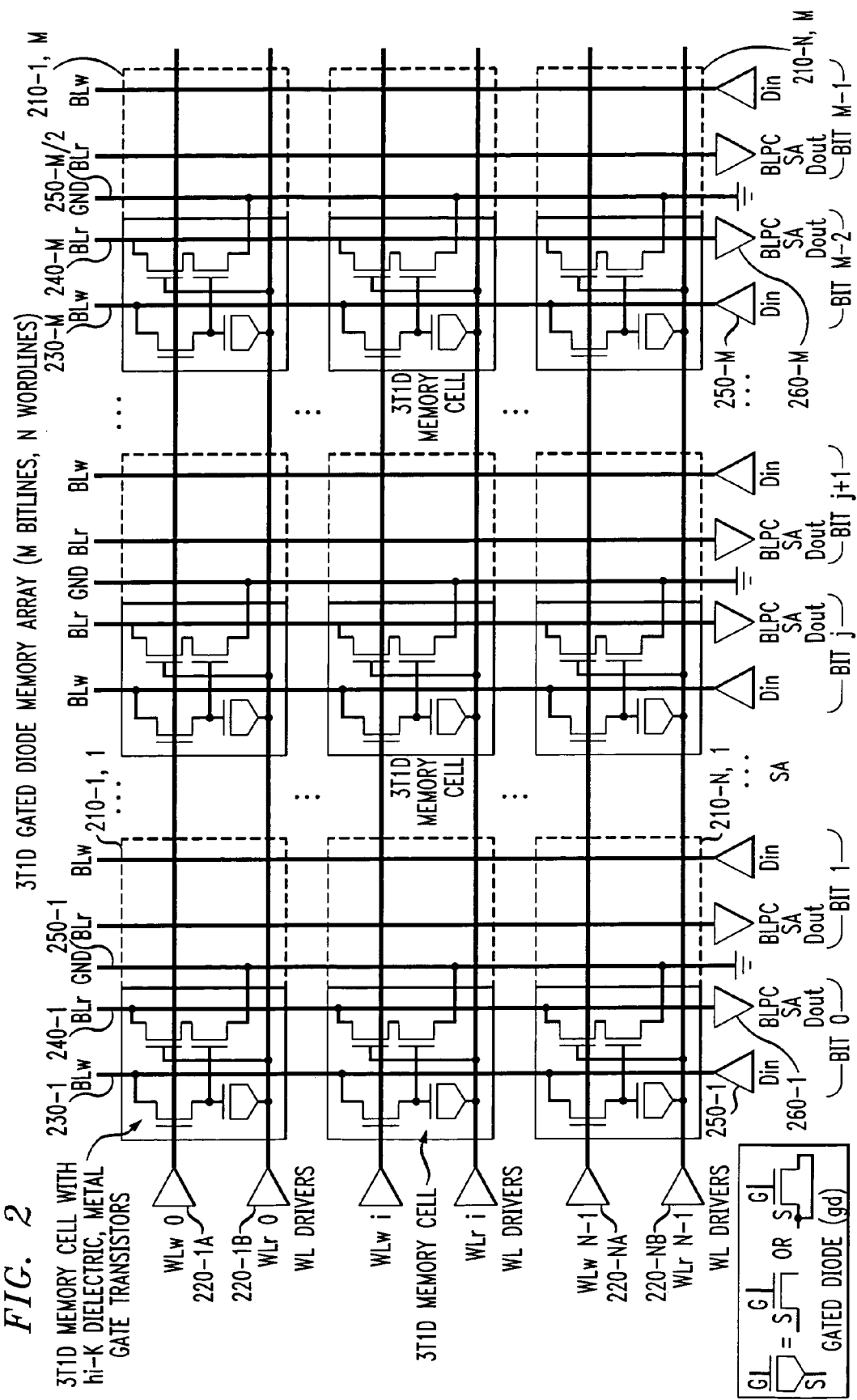

1T1D MEMORY CELL WITH METAL GATE, hi-K DIELECTRIC TRANSITIORS
(LOW GATE LEAKAGE, LOW Ioff, HIGH Ion, SCALABLE CHANNEL)

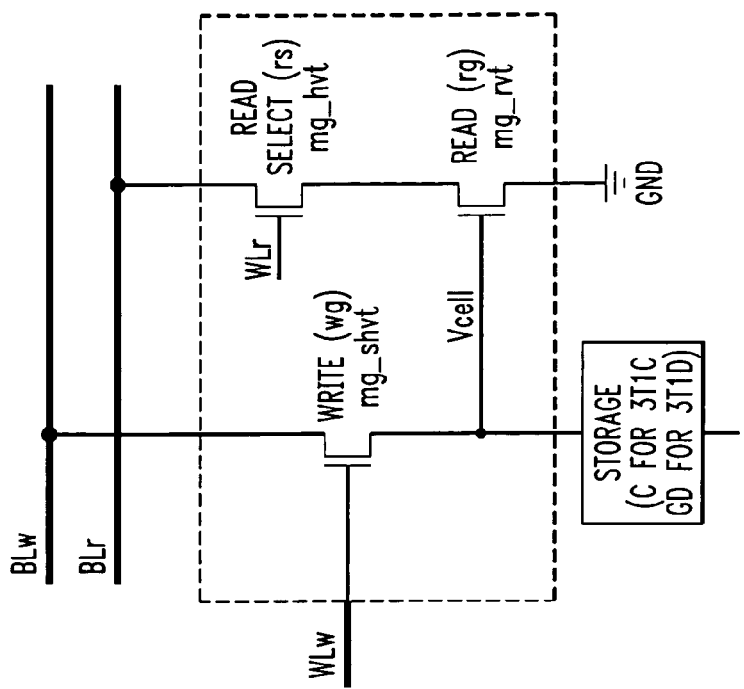
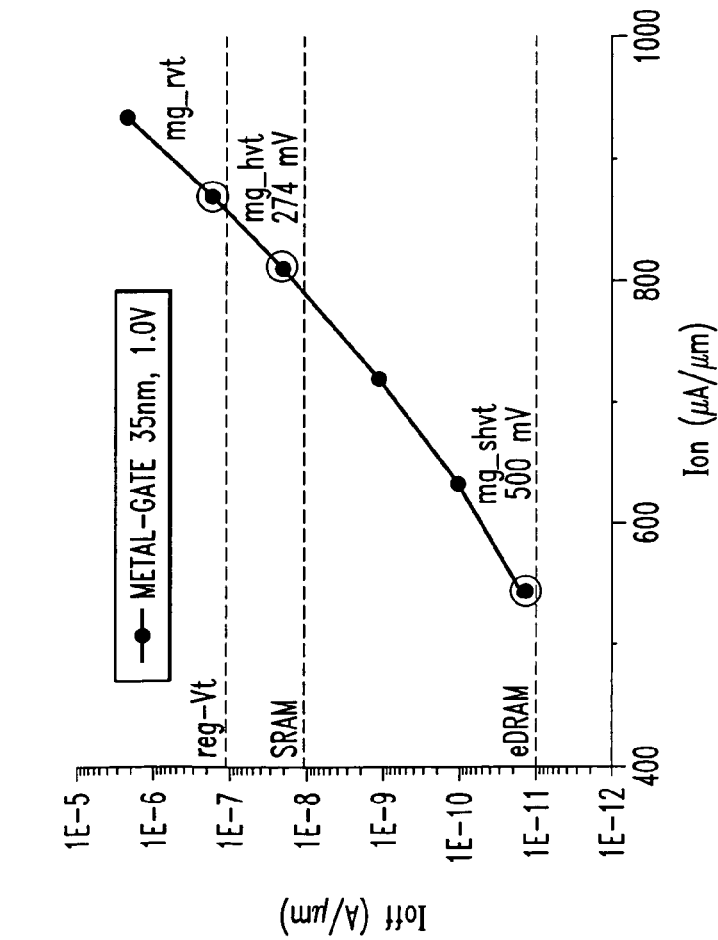
FIG. 4C

BAND DIAGRAM OF 1/4–1/2 BAND GAP METAL/SiO2/P-SILICON GATE STACK

700

DYNAMIC MEMORY CELL STRUCTURES

FIELD OF THE INVENTION

The present invention relates to electronic circuitry and, more particularly, relates to dynamic memory cells.

BACKGROUND OF THE INVENTION

FIGS. 1A-1E show the transistor circuit schematics of conventional 1T1C, 3T, 1T1D, 2T1D, and 3T1D memory cells, respectively. For a detailed description of 1T1C, 3T, 1T1D, 2T1D, and 3T1D memory cells, see, for example, U.S. Pat. No. 3,387,286, entitled "Field-effect Transistor DRAM," issued Jun. 4, 1968; Karp et al, "A 4096-bit Dynamic MOS RAM," ISSCC Digest Technical Papers, pp. 10-11, February 1972; U.S. patent application Ser. No. 10/735,061, entitled "Gated Diode Memory Cells," filed Dec. 11, 2003; and U.S. Pat. No. 7,027,326, entitled "3T1D Memory Cells Using Gated Diodes and Methods of Use Thereof," issued Apr. 11, 2006. The capacitive storage device of the dynamic memory cell can be a capacitor 104 (typically a planar capacitor or a trench capacitor), a gated diode 118, 165, 185, 194, 199 or the gate capacitor of a transistor 132, 152.

The gate stacks 103, 117, 123, 128, 133, 143, 148, 153, 163, 168, 173, 181, 183, 188, 193, 198 of the transistor(s) 102, 116, 122, 127, 132, 142, 147, 152, 162, 167, 172, 182, 184, 187, 191, 192, 196, 197 in the memory cells 110, 115, 120, 140, 160, 180, 190, 195, (collectively known as memory cells 100) typically comprise a polysilicon gate electrode and a gate dielectric material that is typically silicon dioxide (SiO2), forming a gate stack on a silicon substrate.

These conventional silicon-based dynamic memory cells, which utilize a polysilicon gate electrode and silicon dioxide gate dielectric, require a certain gate oxide thickness (typically 20 Å or above) to hold the electric charges above a threshold level (required for a read operation) in order to maintain sufficient retention time (e.g., in the range of 10 μs-10 ms); otherwise, the charges will leak too quickly through the gate and junction of the transistor(s) and destroy the stored data. This leakage is in addition to the sub-threshold leakage through the source-drain channel of the transistor, which is principally determined by the transistor's threshold voltage and temperature.

In conventional silicon technologies with lithographic dimensions above 130 nm, the gate oxide thickness is typically at least 20 Å and, hence, the retention time is not an issue because the gate oxide leakage in the dynamic memory cells is satisfactorily low. In addition, the transistors utilized in the dynamic memory cells have the same gate oxide thickness and channel length as logic transistors. As lithography is scaled below 130 nm, however, the gate oxide of, for example, logic transistor types is thinned below 20 Å to keep the ratio of channel length and gate oxide thickness more or less constant to maintain a reasonable short channel effect, in line with the rules of classical scaling of silicon technology. As a result of the requirement to maintain the gate oxide thickness at 20 Å or above for dynamic memory cells, the short channel effect cannot be controlled if the channel length and width of the dynamic memory cell transistors is to be reduced. Hence, as the lithography dimension shrinks, the size of the transistors in the dynamic memory cell cannot be scaled together with other transistor types, resulting in a larger transistor area for the dynamic memory cell compared to the other transistors (i.e., the ratio of the memory cell area to logic area increases).

It would be desirable to overcome the limitations of prior art approaches.

SUMMARY OF THE INVENTION

Generally, a dynamic random access memory cell is disclosed that comprises a capacitive storage device and a write access transistor. The write access transistor is operatively coupled to the capacitive storage device and has a gate stack that comprises a high-K dielectric (also known as a high-K gate dielectric), wherein the high-K dielectric has a dielectric constant greater than the dielectric constant of silicon dioxide. A memory array is also disclosed, comprising a plurality of bit line structures, each of the bit line structures comprising at least one bit line; a plurality of word line structures, each of the word line structures comprising at least one word line and wherein the word line structures intersect with the bit line structures at a plurality of sites; and one or more dynamic random access memory cells. Each of the one or more dynamic random access memory cells comprises a capacitive storage device; and a write access transistor, wherein the write access transistor is operatively coupled to the capacitive storage device and wherein the write access transistor has a gate stack that comprises a high-K dielectric, wherein the high-K dielectric has a dielectric constant greater than a dielectric constant of silicon dioxide. A computing apparatus employing such a memory array is also disclosed. In one exemplary embodiment, a portion of the memory is embedded in a processor and, in another exemplary embodiment, a portion of the memory is configured as a cache.

In one exemplary embodiment, the novel gate stack further comprises a metal gate electrode coupled to the high-K dielectric. In other exemplary embodiments, the metal gate electrode substantially exhibits a ¼ gap work function or substantially exhibits a band edge work function. The gate stack of the write access transistor of a dynamic random access memory cell may optionally be configured for application of a negative voltage. In another exemplary embodiment, the capacitive storage device comprises a high K dielectric.

The equivalent electrical thickness (Tox) associated with a gate capacitance per unit area of the high-K dielectric is optionally no greater than an equivalent electrical thickness (Tox) of a gate stack comprising a polysilicon gate electrode and a silicon dioxide dielectric; and the gate capacitance per unit area is optionally no less than a gate capacitance per unit area of a gate stack comprising a polysilicon gate electrode and a silicon dioxide dielectric, wherein a channel length of the gate stack comprising the high-K dielectric is substantially the same as a channel length of said gate stack comprising said polysilicon gate electrode and said silicon dioxide dielectric. The physical dielectric thickness associated with a gate leakage per unit area of the high-K dielectric is optionally no less than a physical dielectric thickness of a gate stack comprising a polysilicon gate electrode and a silicon dioxide dielectric; and the gate leakage per unit area is optionally no greater than a gate leakage per unit area of a gate stack comprising a polysilicon gate electrode and a silicon dioxide dielectric, wherein a channel length of the gate stack comprising the high-K dielectric is substantially the same as a channel length of said gate stack comprising said polysilicon gate electrode and said silicon dioxide dielectric.

The metal gate electrode optionally provides a higher threshold voltage for the write access transistor than a polysilicon gate electrode for substantially the same level of silicon substrate doping concentration. The metal gate electrode may also be selected to decrease a sub-threshold leakage of the write access transistor and increase a retention time of the dynamic random access memory cell. The metal gate electrode may be selected to eliminate a polysilicon depletion effect that reduces an equivalent electrical thickness (Tox) of the gate stack in comparison to a polysilicon gate electrode and a silicon dioxide dielectric gate stack. The metal gate electrode may optionally provide a work function between about 4.0 eV and about 5.2 eV.

The threshold voltage of the write access transistor may be selected based on at least one of the following: a sub-threshold off current, a retention time, and a write speed. The disclosed dynamic random access memory cell may optionally include a read transistor that is operatively coupled to the capacitive storage device and has a read transistor gate stack comprising a high-K dielectric, wherein the high-K dielectric has a dielectric constant greater than the dielectric constant of silicon dioxide. The capacitive storage device may optionally be a gated diode.

A method for storing data in a dynamic random access memory cell is disclosed, comprising the steps of: activating a write access transistor, wherein the write access transistor is operatively coupled to the capacitive storage device and the write access transistor has a gate stack, the gate stack comprising a high-K gate dielectric; and writing the data to the capacitive storage device via the write access transistor.

Finally, a method of manufacturing a dynamic random access memory cell is disclosed that comprises the steps of forming a capacitive storage device; forming a source and drain of a write access transistor that is operatively coupled to the capacitive storage device; and forming a gate stack for the write access transistor, wherein the forming a gate stack step further comprises the step of forming a high-K dielectric, wherein said high-K dielectric has a dielectric constant greater than the dielectric constant of silicon dioxide.

A more complete understanding of the present invention, as well as further features and advantages of the present invention, will be obtained by reference to the following detailed description and drawings.

BRIEF DESCRIPTION OF THE DRAWINGS

FIG. 2 is a block diagram of a memory array employing dynamic memory cells in accordance with an exemplary embodiment of the present invention;

FIG. 4C shows an exemplary graph of the off current versus on current for an exemplary transistor with a 35 nm channel length, a high-K dielectric, and a metal gate electrode;

DETAILED DESCRIPTION

Figure 1A:
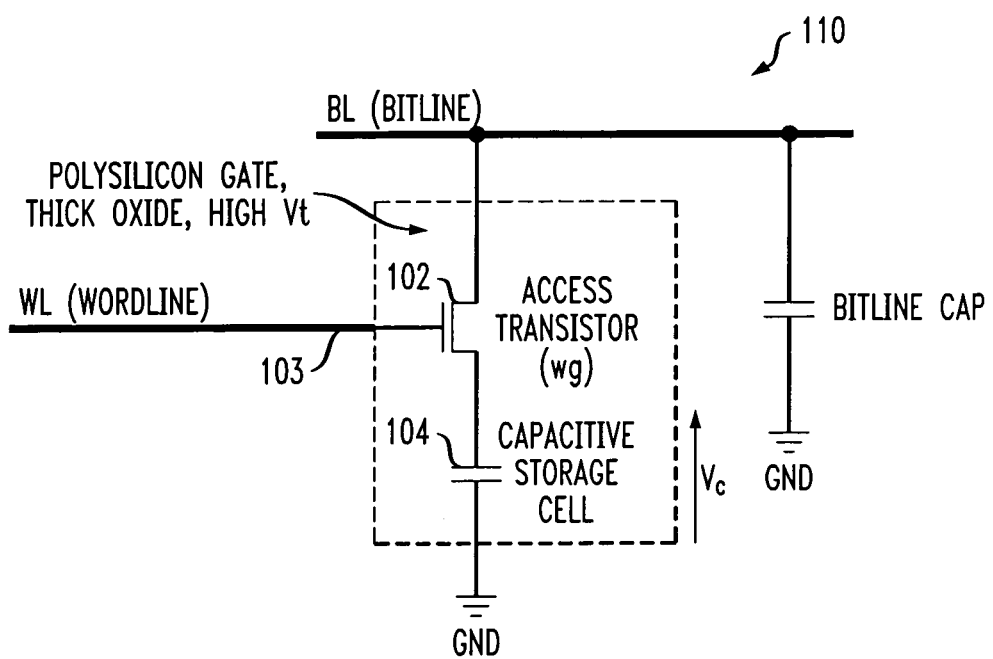
FIGS. 1A-1E show the transistor circuit schematics of conventional 1T1C, 3T, 1T1D, 2T1D, and 3T1D dynamic memory cells, respectively.
Figure 1B:
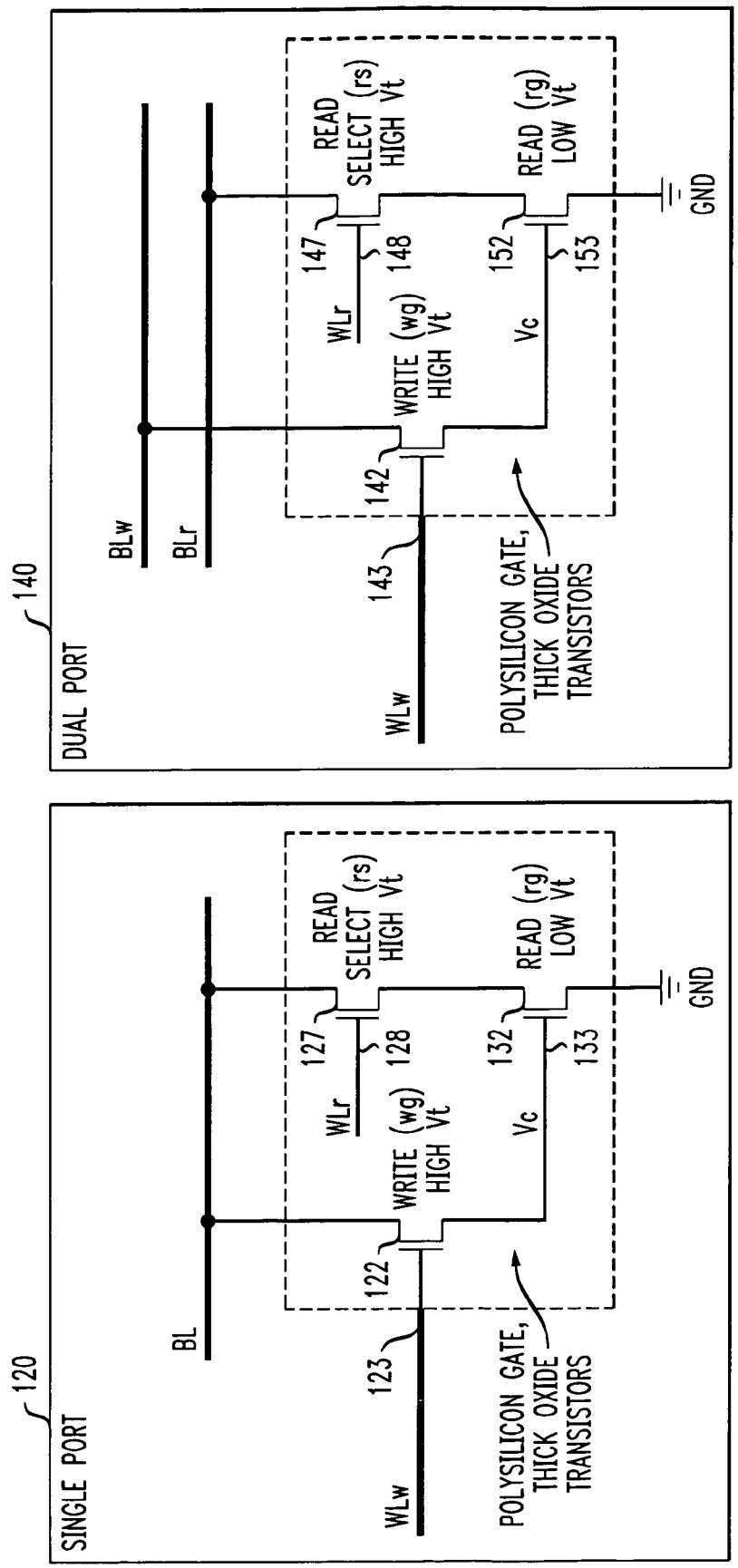
Figure 1C:
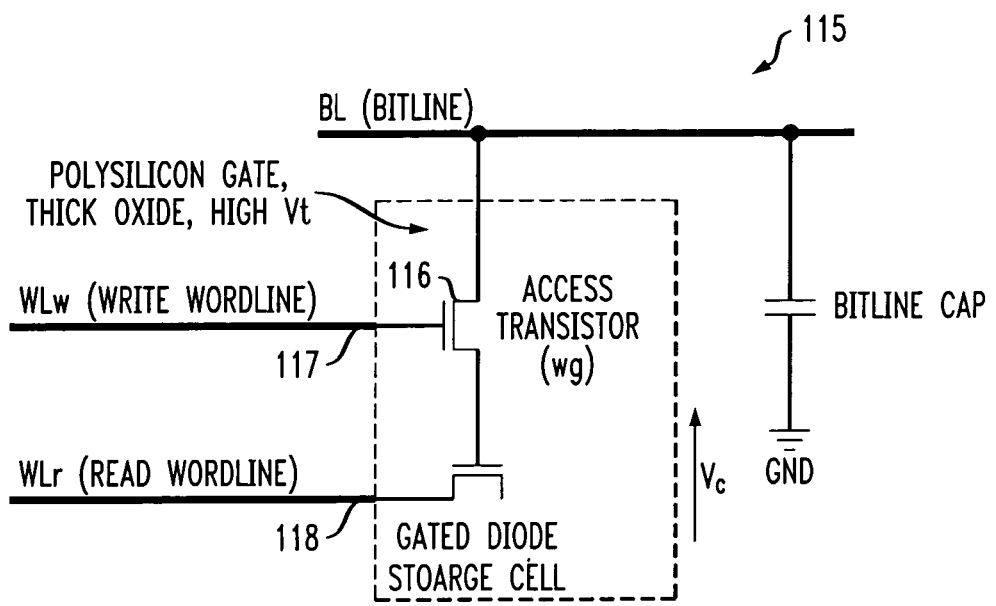
Figure 1D:
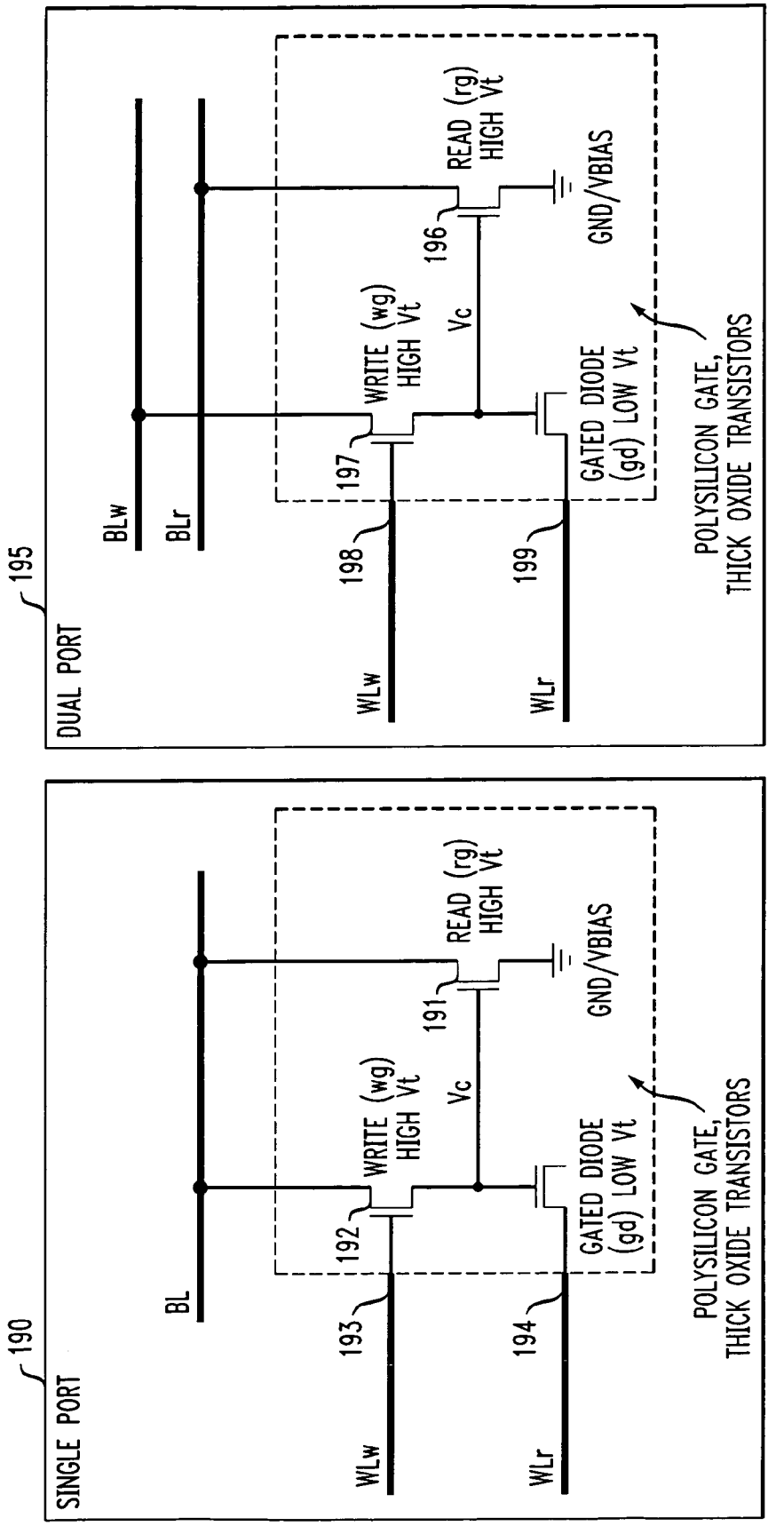
Figure 1E:
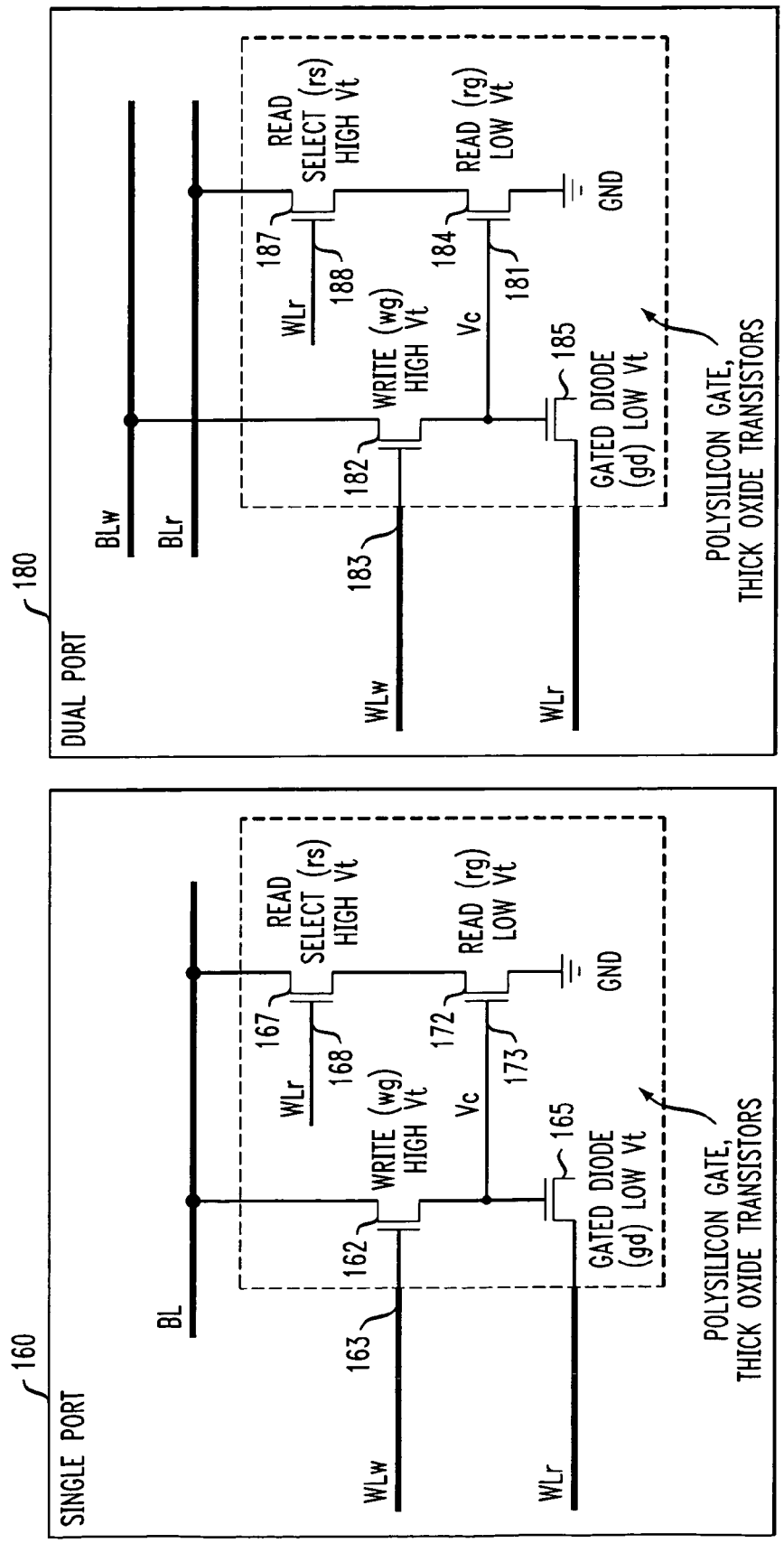
Figure 3A:
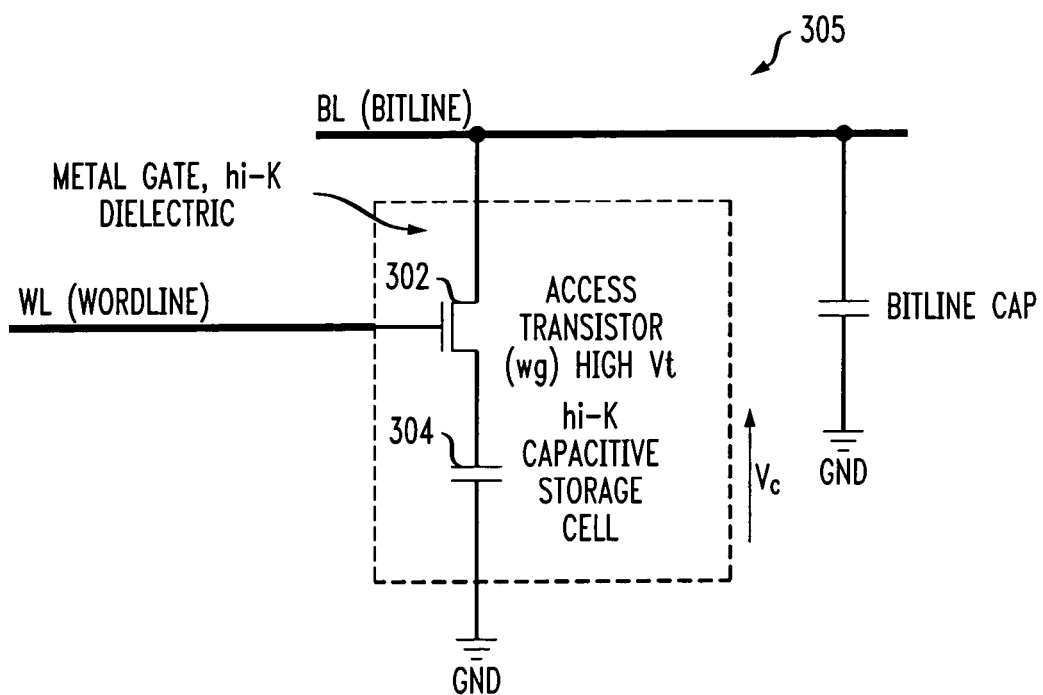
FIGS. 3A-3E show the transistor circuit schematics of the 1T1C, 3T, 1T1D, 2T1D, and 3T1D memory cells using transistors with metal gate electrode and high-K dielectric gate stacks.
Figure 3B:
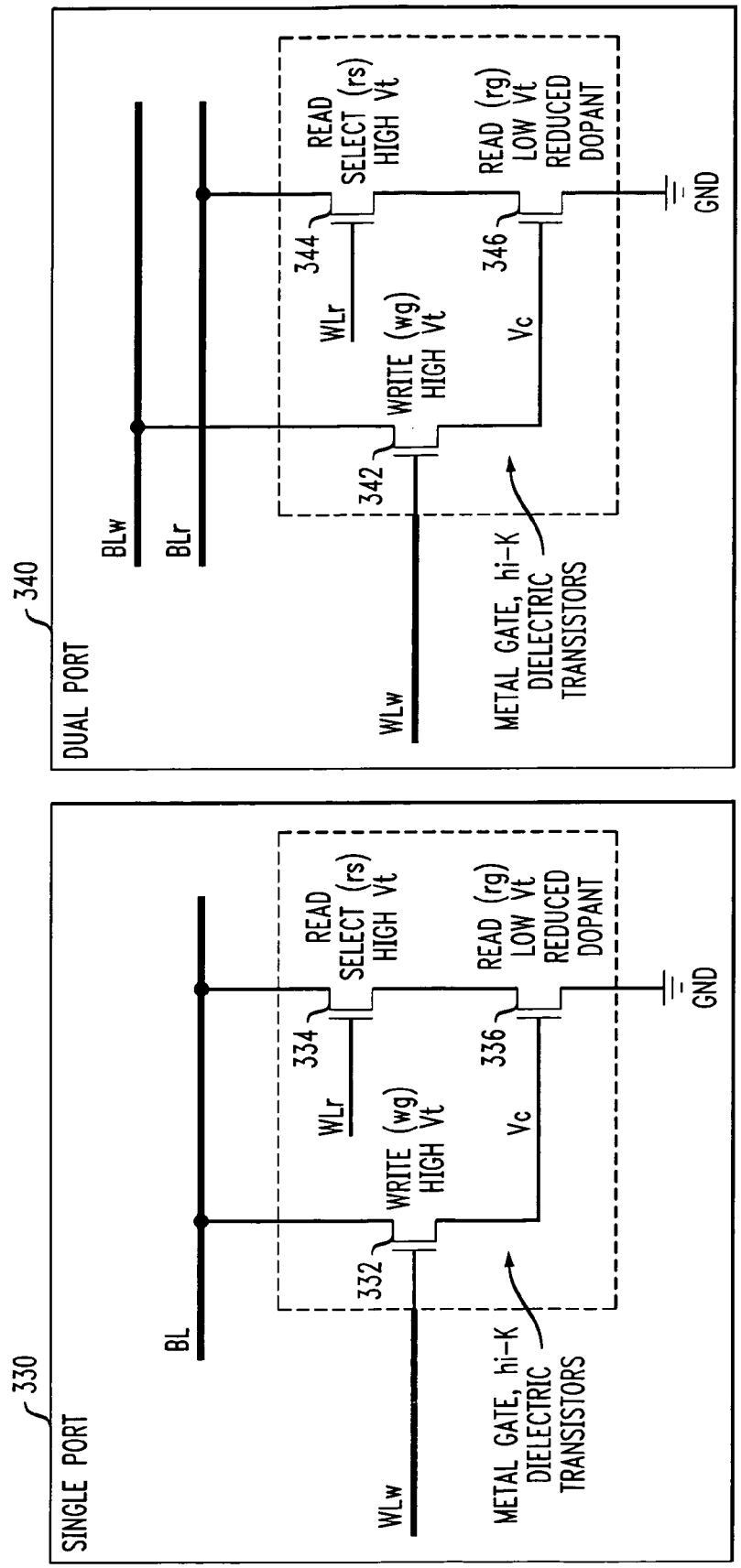
Figure 3C:
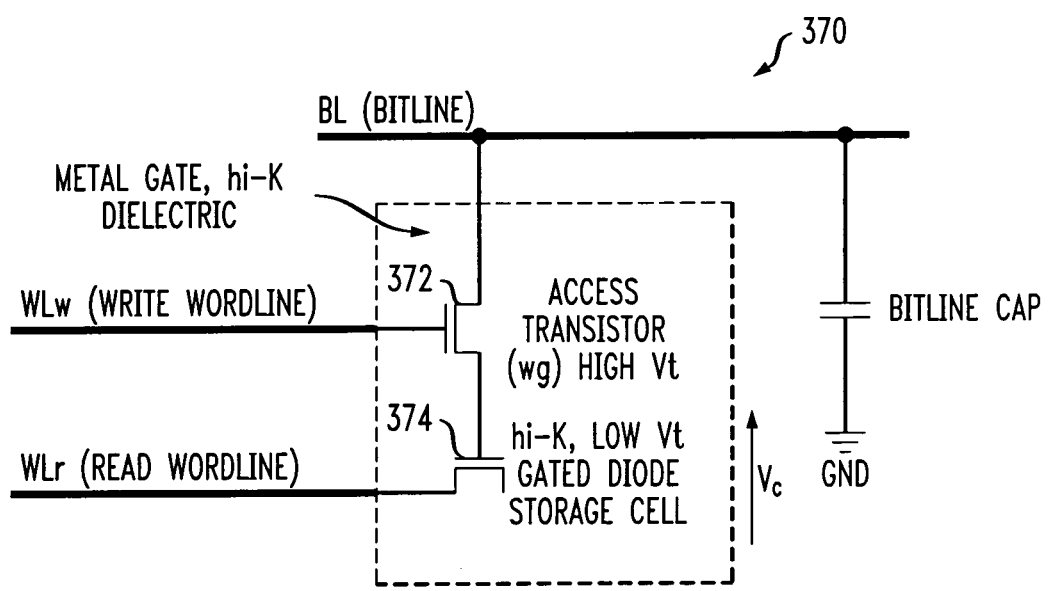
Figure 3D:
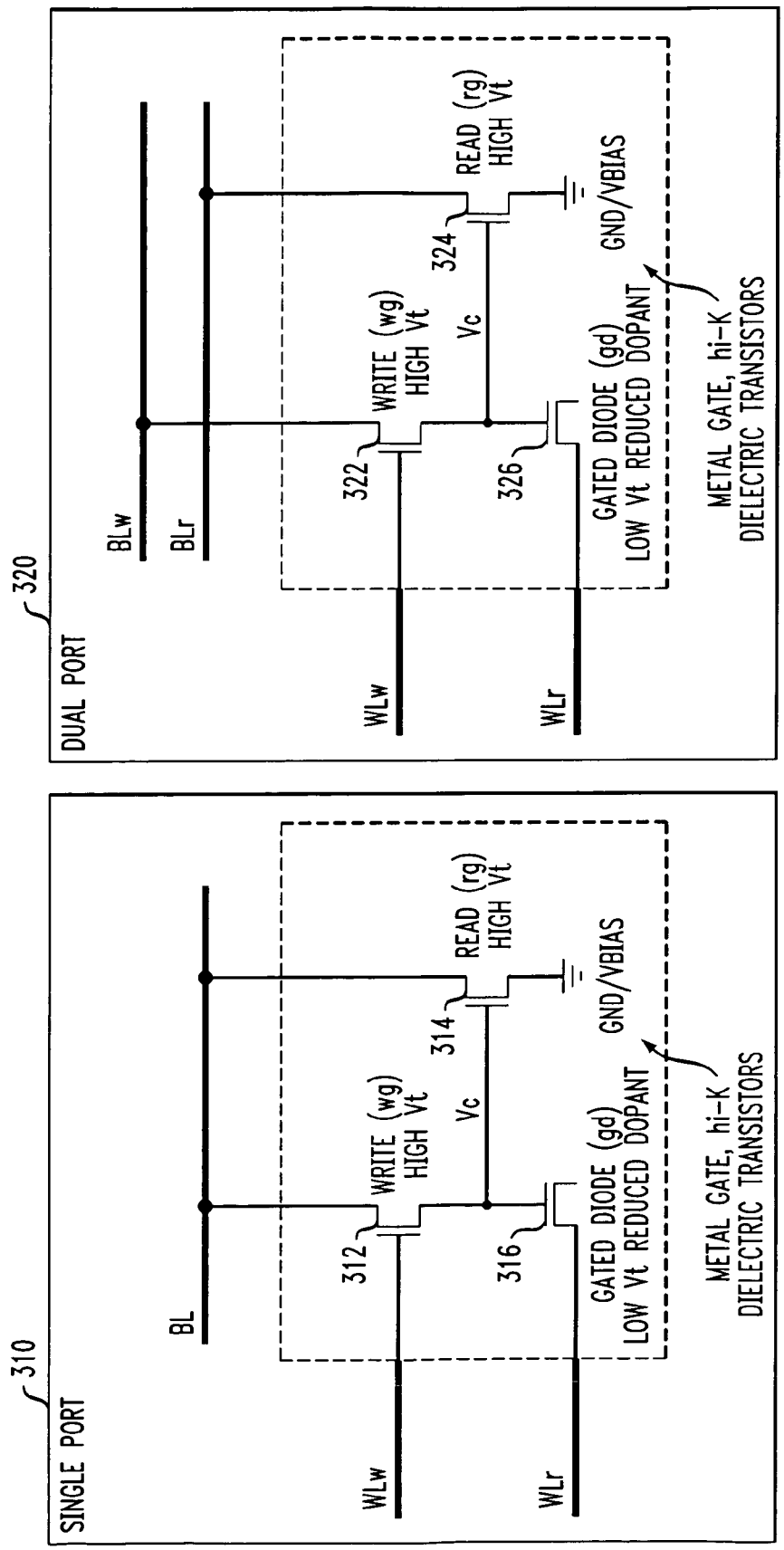
Figure 3E:
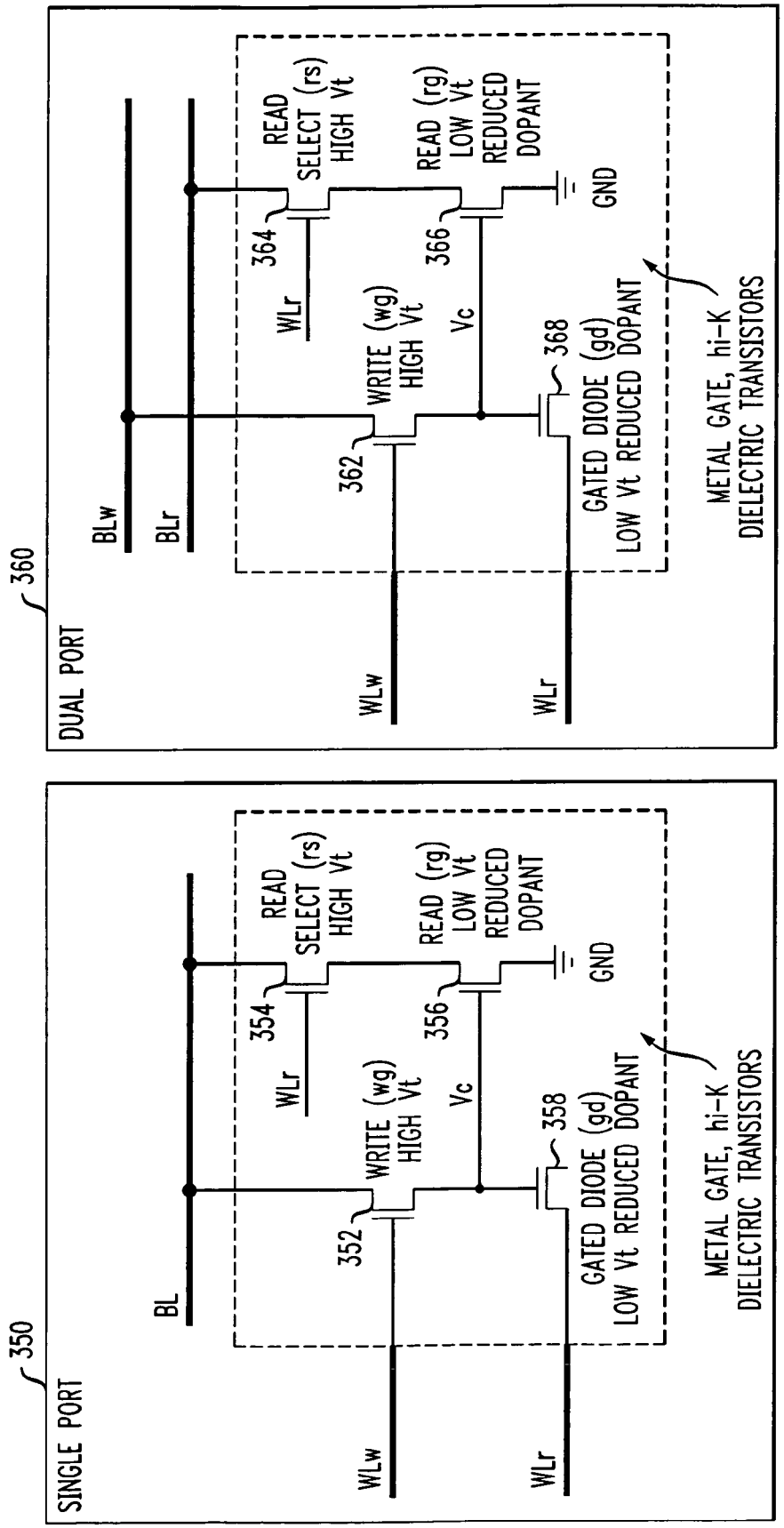

Metal gate electrodes and high-K dielectric have been utilized in the gate stacks of high performance transistors in logic circuits for improving speed performance while keeping the gate leakage low during logic operations. The design of transistors utilizing a high-K dielectric was, however, principally based on power and speed considerations. (See, for example, U.S. Pat. No. 6,916,698 B2, entitled "High Performance CMOS Device Structure with Mid-gap Metal Gate," issued on Jul. 12, 2005, and U.S. Pat. No. 6,475,874 B2, entitled "Damascene NiSi Metal Gate High-K Transistor," issued on Nov. 5, 2002.) Techniques of one or more embodiments of the present invention recognize that a high-K gate dielectric with an optional metal gate electrode, and the associated (optional) transistor optimization, can address the area scaling problem caused by the short channel effect of dynamic memory cells. Such a gate can also serve to reduce the gate leakage current and sub-threshold leakage current, thereby improving the retention time and speed of these memory cells. This can be accomplished without raising the channel doping and increasing the threshold voltage variability. Described herein are various structures and methods for utilizing high-K dielectric gate stacks to improve the retention time (reducing gate leakage, junction leakage, and sub-threshold leakage), improve the performance, and reduce the cell size of dynamic memory cells. The disclosed techniques, in combination with optional methods for varying channel doping and/or threshold voltage, and an optional metal gate electrode, result in one or more of improved retention time, memory speed, and cell area. The disclosed transistor gate stack of the memory cells is based on a high-K dielectric material, with a dielectric constant typically a few times that of silicon dioxide. In one exemplary embodiment of the invention, a metal gate electrode is also utilized. In another exemplary embodiment, all transistors in the memory cell include a metal gate electrode, high-K dielectric gate stack. In an alternative embodiment, only the transistors with leakage that impairs the performance of the memory cell include a metal gate electrode, high-K dielectric gate stack.

In general, transistor leakage is the result of several components, including gate leakage and junction leakage. Gate leakage is due to the tunneling current through the gate oxide (insulator). Junction leakage is made up of two major components: the band to band tunneling current due to the high field at the gate-overlapped silicon surface resulting from a negative gate to source voltage Vgs (also known as gate induced drain leakage (GIDL)), and the band to band tunneling due to the high field from heavy channel impurity doping near the drain junction interface. The gate leakage and the GIDL current decrease exponentially as the gate dielectric thickness increases.

It should also be noted that the sub-threshold leakage current increases exponentially with decreasing threshold voltage. This is important because, when scaling beyond 130 nm lithography, it may become more difficult to control the threshold voltage of the transistor and to keep it above a certain threshold due to the short channel effect and atomic dopant number fluctuation. The control of the threshold voltage of the write access transistors 102, 116, 122, 142, 162, 182, 192, 197 which primarily determines the retention time of the cell 100, may be quite important in many cases. The threshold voltage may be kept high by increasing the doping level, but an increase in doping level results in higher band to band tunneling junction leakage, as well as higher dopant number fluctuations, which makes the sub-threshold current and retention time even more difficult to control.

The high-K dielectric utilized in the gate stack enables a physically thicker gate dielectric that keeps the gate leakage low in the memory cells, while keeping the equivalent electrical thickness (Tox) equal to or lower than that of conventional polysilicon gate electrode, silicon dioxide gate stacks. A thinner (i.e. smaller) Tox improves short channel effect. As a result, scaling to shorter channel length and width can be achieved even with a physically thick gate. The transistor channel length and width of these memory cells can be scaled along with lithography to a 65 nm node and beyond.

The high-K gate stack, together with a proper threshold voltage design for the read path transistors (of the 3T, 2T1D, and 3T1D cells), can deliver higher memory cell performance due to a thinner equivalent Tox and higher drive current. In one exemplary embodiment, by proper assignment of the threshold voltage of the write and read transistors (using different levels of silicon doping concentration), the drive current, standby current, leakage currents, retention time, and performance of the memory cells can be further improved. Additional discussion is provided with respect to FIGS. 3A-3E below.

In another exemplary embodiment of the invention, a metal gate electrode is utilized in the gate stack to provide a higher threshold voltage (e.g., 0.25-0.5 V higher) than a polysilicon gate electrode for the same level of silicon doping concentration, hence decreasing the sub-threshold leakage and increasing the retention time by, e.g., orders of magnitude. Achieving a higher threshold voltage without increasing the doping concentration reduces the dopant number fluctuation and reduces the band to band junction leakage. It potentially eliminates the need for negative word line bias for the write access transistor 102, 116, 122, 142, 162, 182, 192, 197.

The work function of a metal gate electrode, i.e., the amount of energy required to elevate an electron from the Fermi level to a vacuum, depends on the selected material. Many of the metal materials, have a work function around 4.5-4.6 eV, corresponding to the silicon mid-gap level. Such materials are also called ½-gap metals, e.g. tungsten (W) with 4.6 eV. Materials with work functions close to 4.2-4.3 eV, which are referred to as ¼-gap metals, have also been identified, e.g. aluminum (Al) with 4.28 eV, tantalum (Ta) with 4.25 eV, for use in the gate stack as the work function is substantially a ¼ silicon energy gap away from the silicon conduction band. (For a detailed description of metals with different work functions, see, for example, Yeo et al., "Metal-dielectric Band Alignment and its Implications for Metal Gate Complementary Metal-oxide-semiconductor Technology," Journal of Applied Physics, Vol. 92, No. 12, 2002.) Compared to conventional n+ polysilicon (about a 4.02 eV work function) gates for N-type transistors, and conventional p+ polysilicon (about a 5.17 eV work function) gates for P-type transistors, the ¼-gap and ½-gap metal gate electrodes can provide about 0.25V and about 0.5V higher threshold voltages, respectively, with the same channel doping design. Hence, metal gate electrodes can reduce the sub-threshold leakage current of the write access transistors 102, 116, 122, 142, 162, 182, 192, 197 of the memory cells 100, and provide longer retention time, without resorting to increasing the channel doping concentration. As noted earlier, increasing the doping concentration has the adverse effect of increased threshold voltage variation due to dopant number fluctuations and increased band to band junction leakage.

FIG. 2 shows a plurality of gated diode memory cells 210-11 through 210-NM formed by placing the cells in a two dimensional array, with write word lines (coupled to drivers 220-1A through 220-NA) and read word lines (coupled to drivers 220-1B through 220-NB) running in parallel in one direction, e.g., horizontally, and write bit lines 230-1 through 230-M, read bit lines 240-1 through 240-M and ground (GND) lines 250-1 through 250-M/2 running orthogonally, e.g. vertically. The intersection of a bit line and a word line defines the location of a memory cell, or bit of data storage. Additionally, write bit line drivers 250-1 through 250-M and read bit line sense amplifiers 260-1 and 260-M are used. It should be noted that "BLPC" in the figures means bit line precharge, as the read bit lines 240-1 through 240-M are typically precharged during a read operation, and "SA" stands for a "sense amplifier" used for detecting the signal on a read bit line (BLr) during a read operation. As used herein, including the claims, "bit line structures" and "word line structures" are intended to encompass one or more bit lines or word lines, respectively, associated with a row or column of cells, e.g., a paired read and write word line form a word line structure.

FIGS. 3A-3E show the circuit schematics of exemplary embodiments of the 1T1C 305, 3T 330, 340, 1T1D 370, 2T1D 310, 320, and 3T1D 350, 360 memory cells using transistors 302, 312, 314, 322, 324, 332, 334, 336, 342, 344, 346, 352, 354, 356, 362, 364, 366, 372 (collectively known as transistors 300) incorporating one or more features of one or more exemplary embodiments of the invention. Each exemplary embodiment 1T1C 305, 3T 330, 340, 1T1D 370, 2T1D 310, 320 and 3T1D 350, 360 includes a capacitive storage device, e.g. capacitor 304, read transistors 314, 324, 336, 346, 356, 366, and gated diode 374, 316, 326, 358, 368 (collectively known as capacitive storage device CSD), that is operatively coupled to a write transistor 302, 312, 322, 332, 342, 352, 362, 372 (collectively known as write access transistor WAT). ("Operatively coupled" is defined as meaning the components are electrically interconnected either directly or indirectly through other elements, devices or components so as to provide functionality for a given operation, e.g., reading or writing data.) Data is stored in the memory cells 1T1C 305, 3T 330, 340, 1T1D 370, 2T1D 310, 320, and 3T1D 350, 360 by activating the write access transistor WAT, and writing the data to the capacitive storage device CSD via the write access transistor WAT.

Figure 4A:
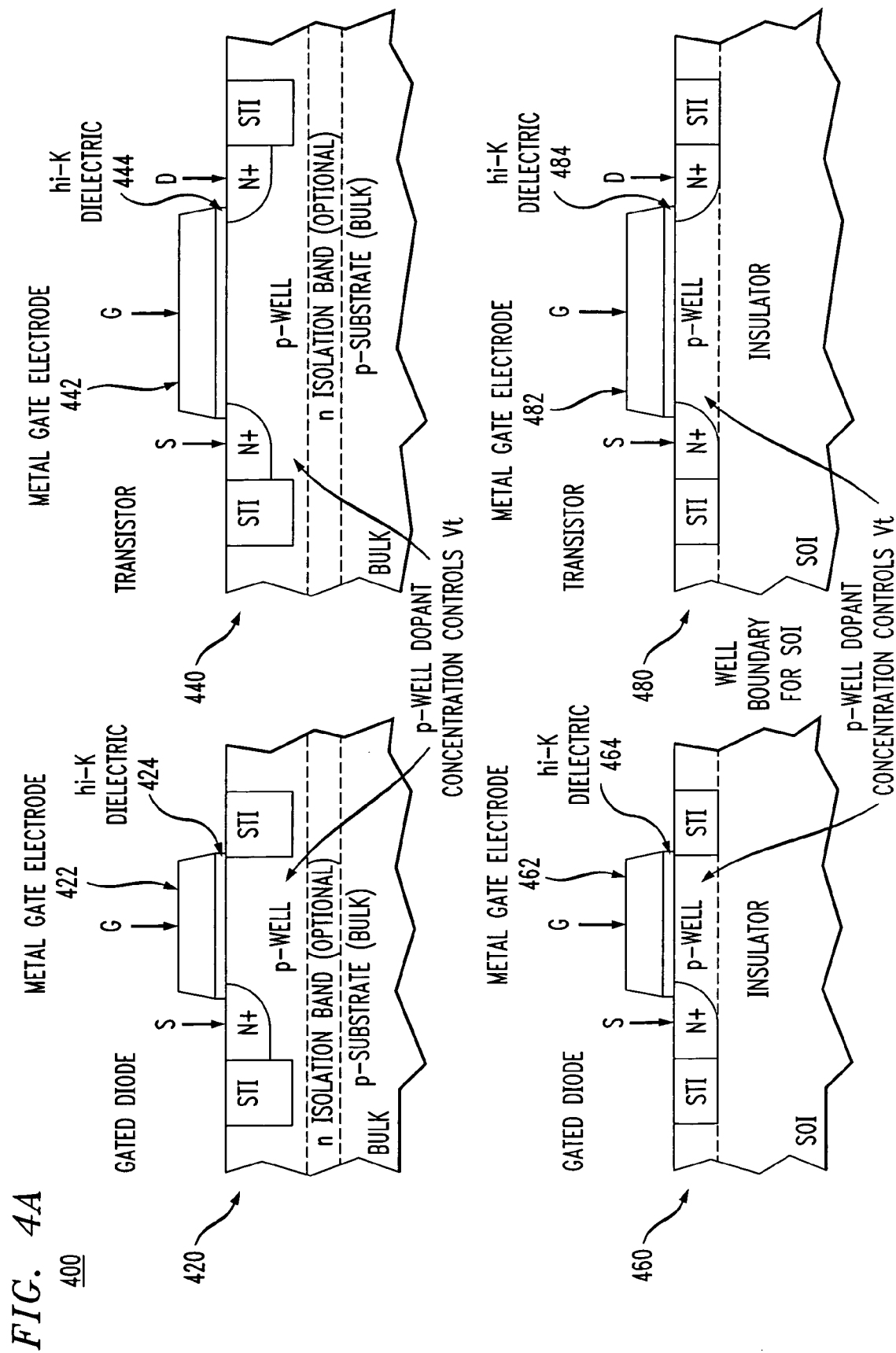
FIG. 4A shows the cross-sections of an N-type transistor (NFET) in bulk silicon and silicon on insulator (SOI) substrates.

Each transistor 300 comprises a metal gate electrode and high-K gate dielectric gate stack. The cross-sections of an N-type transistor (NFET) in bulk silicon and silicon on insulator (SOI) are shown in FIG. 4A. Each transistor 300, 420, 440, 460, 480 comprises a metal gate electrode 422, 442, 462, 482 and high-K gate dielectric 424, 444, 464, 484. It will be understood that, for the schematics of FIGS. 3A-3E and the N-type transistor shown in FIG. 4A, a complementary version using a P-type transistor (PFET) with a high-K gate dielectric gate stack can also be employed. The capacitive storage device may also optionally comprise a high-K dielectric. Further, the capacitive storage device may optionally be a gated diode with an optional high-K dielectric gate stack.

The high-K gate dielectric induces a higher surface electric field in the silicon and allows a physically thicker dielectric while delivering the same or higher gate capacitance per unit area and drive current (I_ON). The drive current is given by:

$$I\_ON = u\, Cox(W/L)(Vgs-Vt)^2/2 = u(K/Tph)(W/L)(Vgs-Vt)^2/2, \tag{1}$$

where u is the mobility, Cox is the gate capacitance per unit area, W and L are the gate width and length, Tph is the physical gate dielectric thickness, K is the dielectric constant, Vgs is the gate to source voltage, and Vt is the threshold voltage. As K is increased, Tph can be increased proportionally to provide the same drive current I_ON. The dielectric constant for silicon dioxide is K_SiO2=3.9 K0 (where K0 is the dielectric constant in free space). The equivalent gate oxide thickness is defined as Tox=Tph*(K_SiO2/K). The dielectric constant K for high-K transistors is typically a few times that of SiO2, e.g., 10 K0-20 K0.

In one exemplary embodiment, the threshold voltage of the transistor formed can be further adjusted by varying the level of channel doping concentration in the silicon substrate for a given type of metal gate electrode with a certain work function and flat band voltage. For an improved memory cell design, it is desirable for the write access transistor WAT to have a higher threshold voltage in order to reduce the sub-threshold leakage current (for higher retention time). On the other hand, it is advantageous for the read transistor 314, 324, 336, 346, 356, 366 to have a lower threshold voltage to increase its current driving strength (for a given transistor size), which determines the maximum frequency of a memory cell. For the 3T and 3T1D memory cells 330, 340, 350, 360, the threshold voltage of the read select transistor(s) 334, 344, 354, 364 should be high enough to limit the standby current and to save power for those cells that are not selected or active. For the 2T1D cell 310, 320, and the 3T1D cell 350, 360, the gate diode threshold voltage can be relatively low. The metal gate transistors together with different levels of doping concentration for different threshold voltage assignments provide design enhancements for the retention time, performance, and power for the memory cells.

Figure 4B:
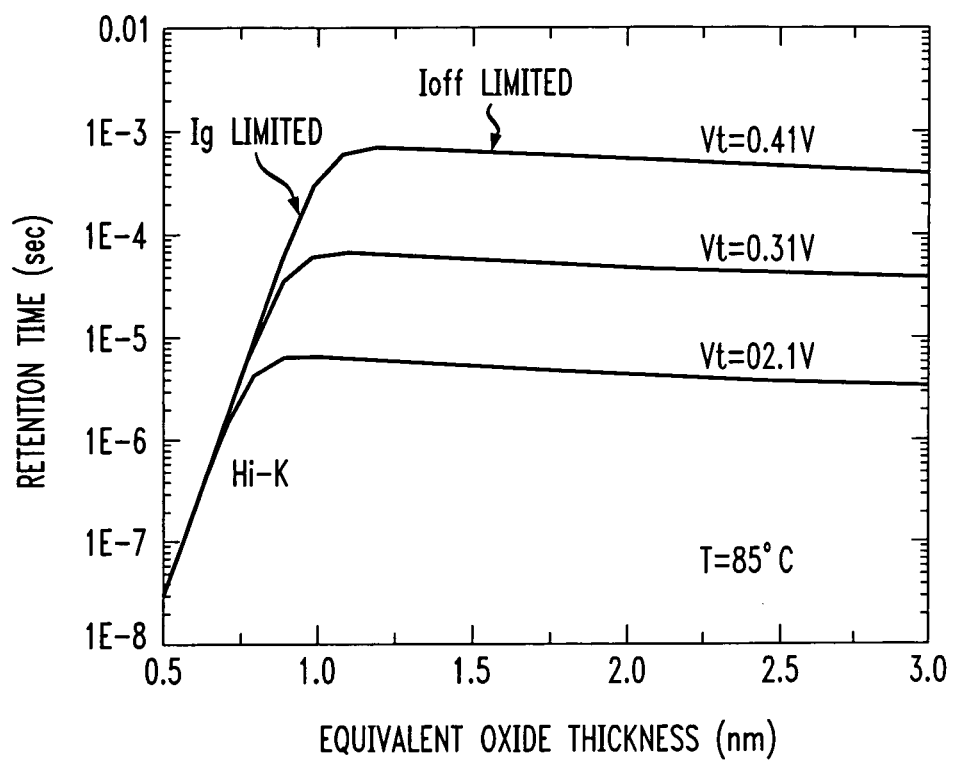
FIG. 4B shows an exemplary graph of the retention time versus equivalent oxide thickness for three exemplary threshold voltages of an exemplary high-K transistor.

In summary, the high-K dielectric enables a physically thicker gate dielectric in order to reduce the gate leakage while keeping the equivalent Tox the same or thinner. FIG. 4B shows an exemplary graph of the retention time versus equivalent oxide thickness for three exemplary threshold voltages of an exemplary high-K transistor. A high-K dielectric provides, for example, a solution for scaling equivalent oxide thickness while meeting the retention time requirement. (Note that, by example and without limitation, the high-K dielectric is assumed to have a dielectric constant that is double the dielectric constant of silicon dioxide, or twice as physically thick for the same electrical thickness.) A thinner Tox enables a shorter channel length (down to 35 nm and below). A shorter channel length combined with a thinner Tox delivers higher drive current for the same gate overdrive (Vgs–Vt). FIG. 4C shows an exemplary graph of the off current versus on current for an exemplary transistor with a 35 nm channel length, a high-K dielectric, and a metal gate electrode. The higher drive current (I_ON) improves the read speed and clock frequency, and improves the retention time and frequency tradeoff in dynamic memory cells. In one exemplary embodiment, higher performance memory cells can be designed by utilizing high threshold voltage metal gate electrode, high-K dielectric transistors for the transistors that require low sub-threshold leakage, high retention time, (e.g., write transistors) and low standby power; and low threshold voltage metal gate electrode, high-K dielectric transistors with reduced doping concentration for the transistors that require higher ON current (e.g., read transistors).

¼-½ Gap Metal Gate Transistor with High-K Dielectric

Figure 5A:
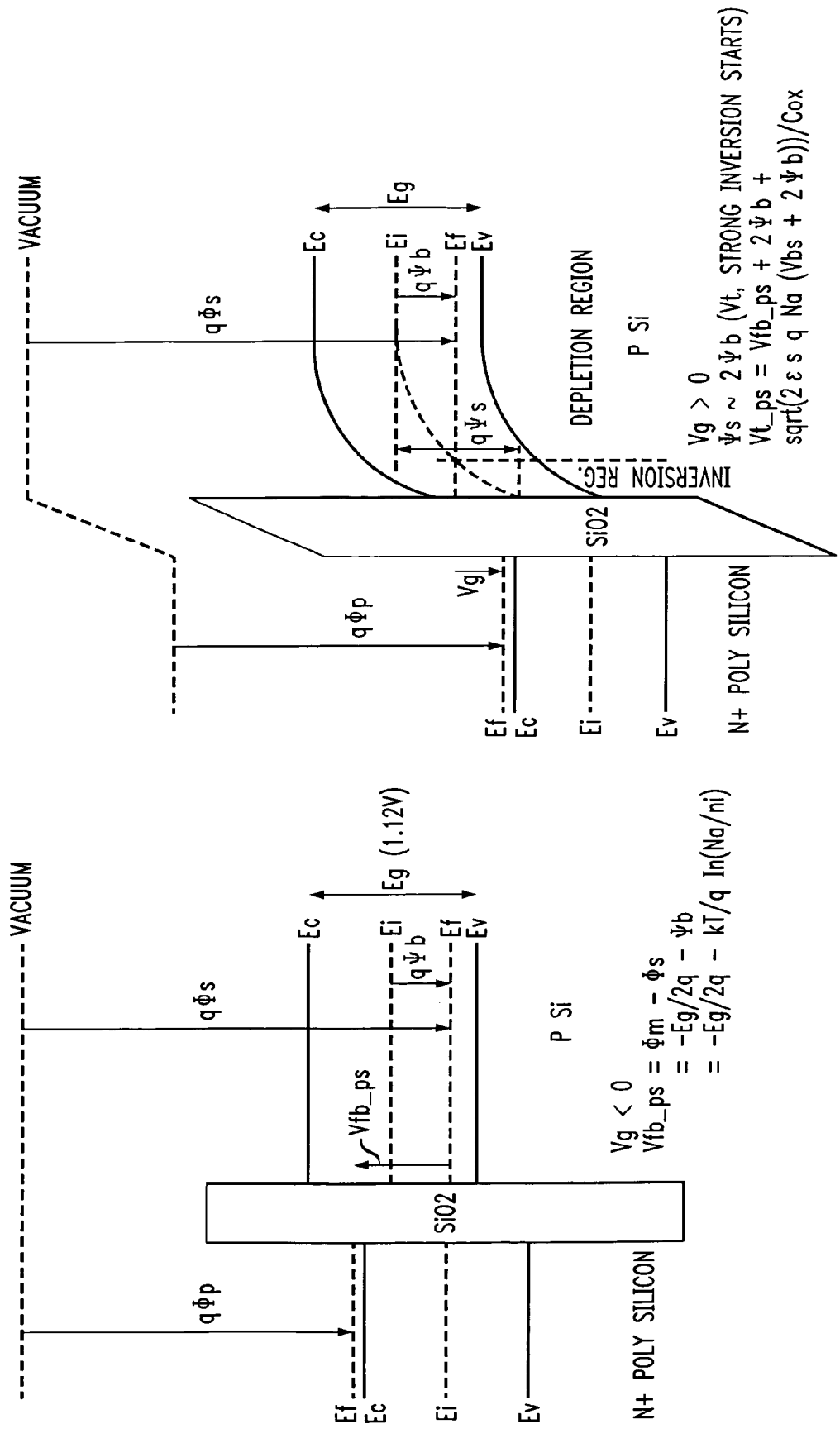
FIG. 5A shows the band diagram of an N+ polysilicon gate electrode, silicon dioxide dielectric gate stack.
Figure 5B:
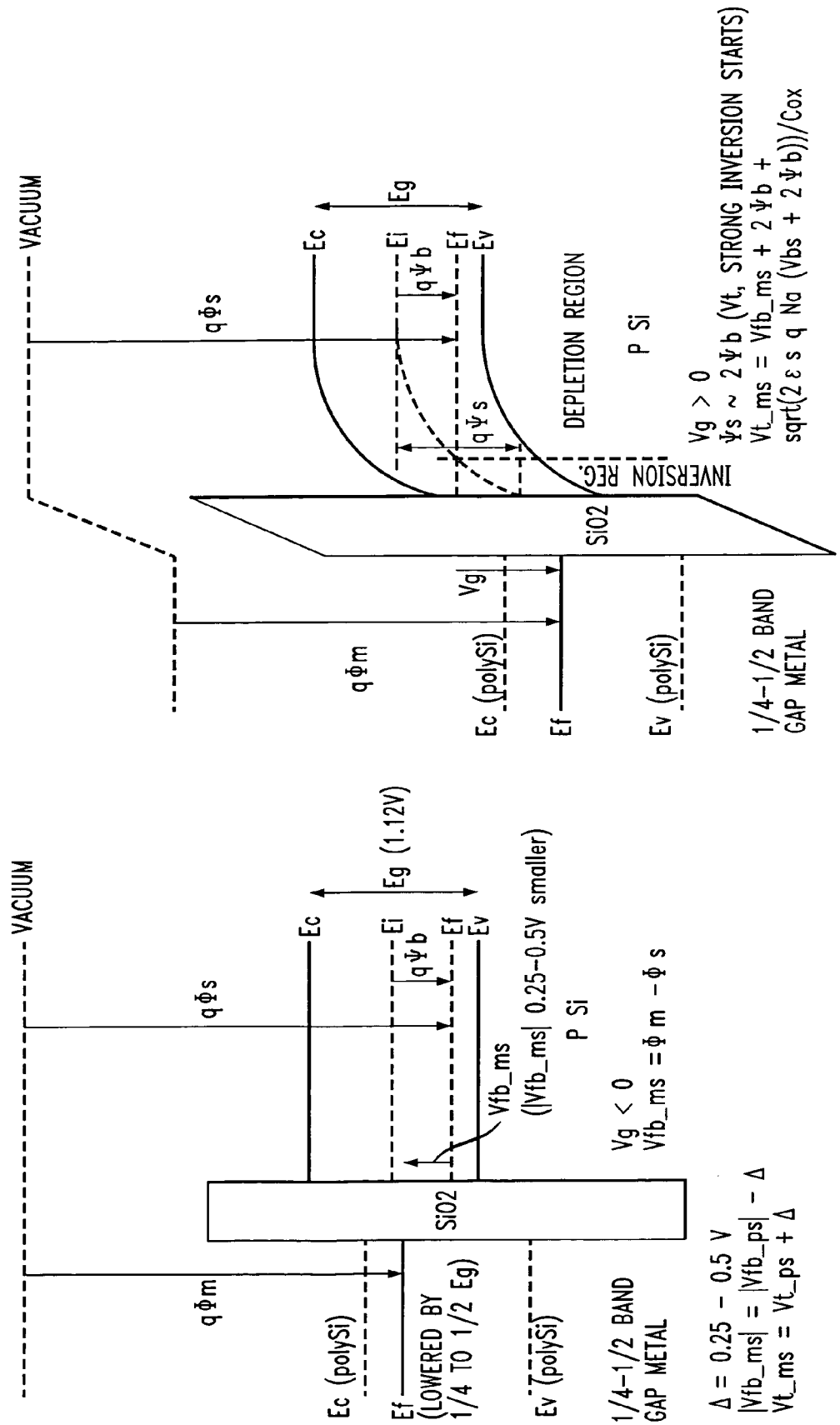
FIG. 5B shows the band diagram of a gate stack comprising a metal gate electrode with a ¼-½ band gap, and a silicon dioxide dielectric gate stack.
Figure 5C:
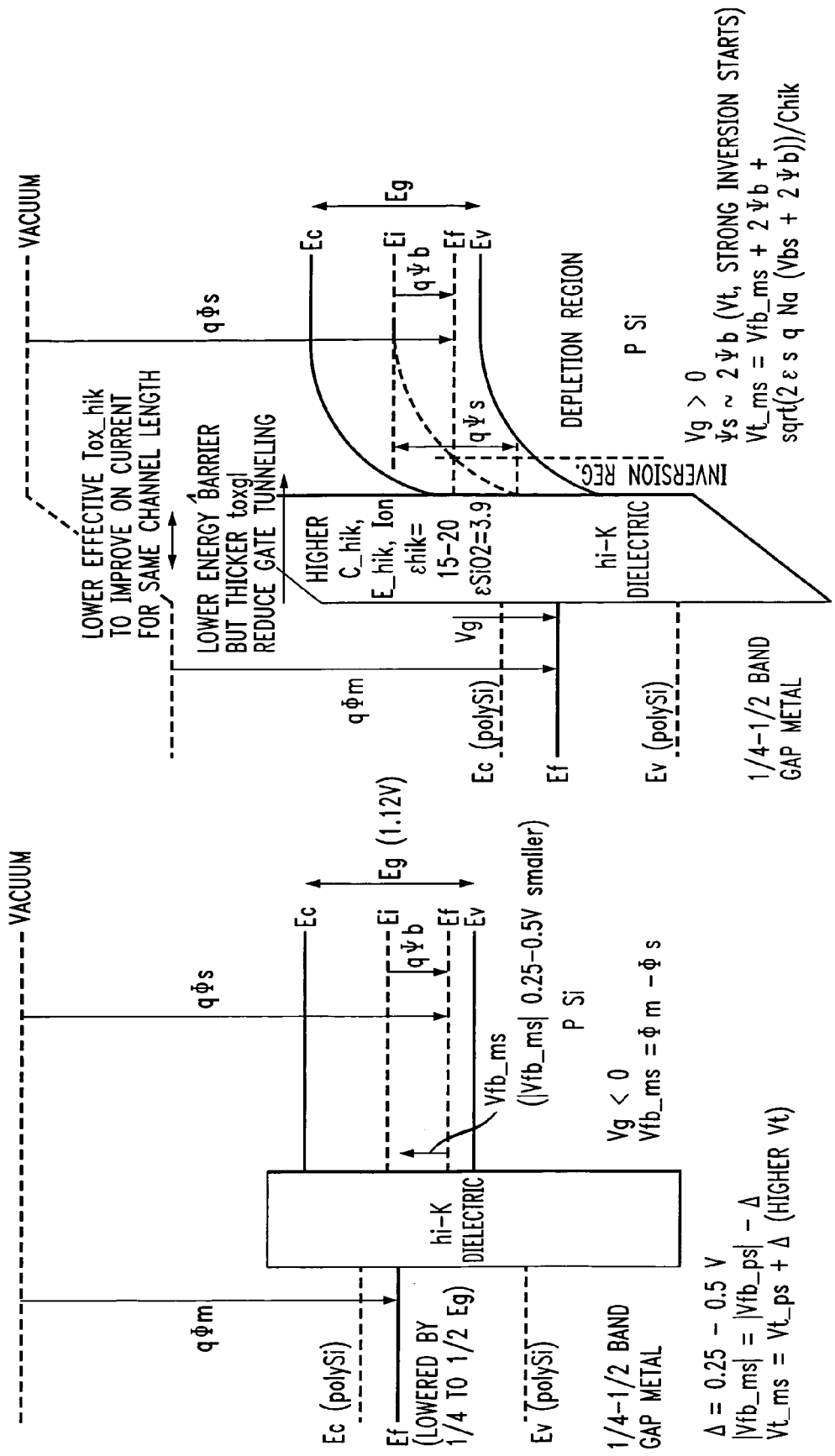
FIG. 5C shows the band diagram of a metal gate electrode with a ¼-½ band gap, high-K dielectric, silicon gate stack.

When a high-K dielectric is used with a polysilicon gate electrode, the electron mobility in the inversion channel is degraded as compared to the conventional polysilicon gate electrode, silicon dioxide gate stack. The use of a metal gate in place of a polysilicon gate has been shown to recover the electron mobility with a high-K gate dielectric to the same level as a polysilicon gate electrode, silicon dioxide stack (see, for example, Ku et al., "Low Tinv (≤1.8 nm) Metal-Gated MOSFETs on SiO2 Based Gate Dielectrics for High Performance Logic Applications," 2003 International Symposium on Solid State Devices and Material (SSDM), September 2003). In addition, the metal gate electrode provides a thinner effective gate dielectric due to the elimination of the polysilicon depletion effect. Therefore, the high-K dielectric, metal gate electrode gate stack can also provide performance enhancement over the conventional polysilicon/silicon dioxide gate stack. FIG. 5A shows the band diagram of an N+ polysilicon gate electrode, silicon dioxide dielectric gate stack. FIG. 5B shows the band diagram of a gate stack comprising a metal gate electrode with a ¼-½ band gap, and a silicon dioxide dielectric gate stack. FIG. 5C shows the band diagram of a metal gate electrode with a ¼-½ band gap, a high-K dielectric gate stack, with a larger physical gate thickness to reduce gate leakage, but a smaller equivalent Tox (compared to a polysilicon gate electrode, silicon dioxide gate stack) for a larger gate capacitance Cox to reduce the short channel effect and improve the ON current. Transistors comprising a metal gate typically have a gate work function that is substantially ¼ to ½ band gap higher than that of an N+ polysilicon gate electrode. As a result, the substantially ¼ to ½ band-gap metal gate electrode has a flat band voltage (Vfb_ms) with a smaller magnitude (Vfb_ms<0 for N-type transistor), between about 0.25-0.5 V, than the flat band voltage (Vfb_ps) of a polysilicon gate electrode gate stack. The flat band voltage can be expressed as $$|Vfb\_ms| = |Vfb\_ps| - \text{delta}, \tag{2}$$

where delta=0.25–0.5 V. The threshold voltage (Vt) is given by $$Vt = Vfb + 2\psi b + \sqrt{2K\_si\, q\, Na(Vbs + 2\psi b)}/Cox, \tag{3}$$

where Vfb is the flat band voltage, $\psi$ b is the difference in potential that corresponds to the difference between the intrinsic energy level (Ei) and the Fermi level (Ef) in the band diagram (see FIGS. 5A-5C), K_Si is the dielectric constant of silicon, Vbs is the substrate bias voltage, and Cox is the equivalent gate oxide capacitance. Hence, the threshold voltage of a metal gate electrode transistor (Vt_ms) is higher than the threshold voltage of a polysilicon gate electrode transistor (Vt_ps) by about delta (0.25-0.5 V) for the same amount of doping Na. Thus, a higher Vt can be achieved without the need to resort to increased doping.

Metal gate electrodes made up of a substantially band edge metal (wherein the work function is close to the conduction band) can also be considered. The addition to the threshold voltage in this case would be smaller. The choice of the type of metal to form the metal gate electrode depends on the manufacturing process and yield, and the resulting threshold voltage of the transistors has a direct impact on the memory cell retention time (wherein Vt should be higher), read and write speed (wherein Vt should be lower) and the type of memory cell (1T1C, 3T, 1T1D, 2T1D, 3T1D) under consideration.

Leakage Mechanism in Dynamic Memory Cells

Figure 6A:
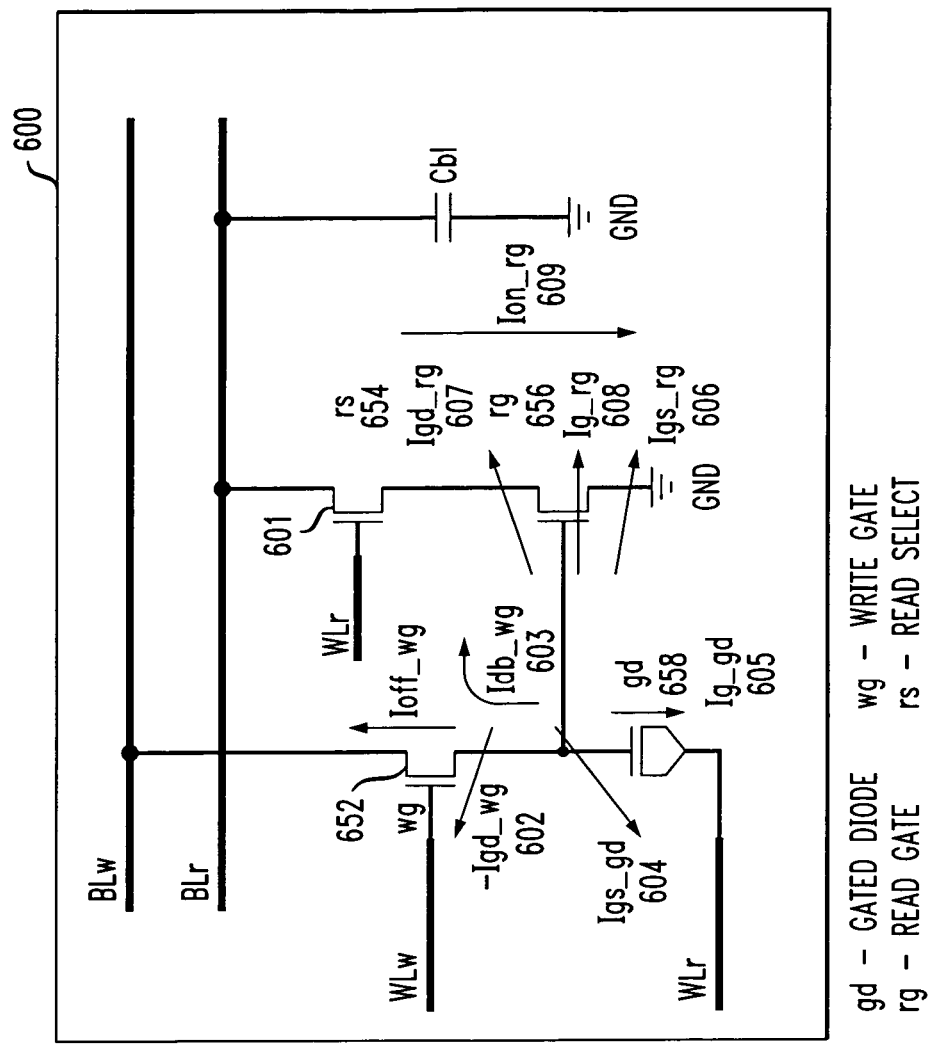
FIG. 6A shows the various current components that lead to cell voltage drop at a storage node.

FIG. 6A shows the various current components that lead to the cell voltage drop at a storage node, thereby shortening the retention time. For the write access transistor WAT, Ioff_wg 601 is the sub-threshold leakage current, Igd_wg 602 is the gate to drain leakage current, and Idb_wg 603 is the drain to body leakage current. The higher threshold voltage (e.g., 0.25-0.5 V higher) offered by the substantially ¼ to ½ band gap metal gate electrode, for a similar level of silicon doping, significantly reduces the Ioff_wg 601, e.g., by a few orders of magnitude. For a sub-threshold slope of, for example, 10 times decrease of sub-threshold leakage current for every 0.1V increase in Vt, the Ioff_wg 601 would be reduced by about 300-100000 times. A high-K dielectric is physically thicker than that of a silicon dioxide dielectric for a similar equivalent Tox, which reduces the tunneling leakage current through the gate dielectric in the write access transistors WAT (also denoted by "wg" in FIGS. 1A-1E, 3A-3E, 4C and 6A), namely, Igd_wg 602.

For the 3T, 2T1D, 3T1D memory cells 330, 340, 350, 360 with a separate read circuit (comprising transistors 656 for the 2T1D, and comprising transistors 654, 656 for the 3T and 3T1D), there are additional leakage currents (as shown). For the gated diode (gd) 658 (for the memory cells 1T1D, 2T1D and 3T1D), Igs_gd 604 is the gate to source leakage current, and Ig_gd 605 is the gate leakage current to the body (for SOI) or silicon substrate (for bulk). For the read transistor (rg) 656, Igs_rg 606 is the gate to source leakage current, Igd_rg 607 is the gate to drain leakage current, and Ig_rg 608 is the gate leakage current. A high-K dielectric is physically thicker than that of a silicon dioxide dielectric for a similar equivalent Tox, which reduces the tunneling leakage currents through the gate dielectric in the gated diode 658, namely Igs_gd 604, Ig_gd 605, and in the read transistors 656, namely, Igs_rg 606, Igd_rg 607, and Ig_rg 608.

Ion_rg 609 is the active ON current through the read transistor (rg) 656 for a read operation, discharging the read bit line BLr as the read select transistor (rs) 654 is ON. Ioff_rg (not shown) is the sub-threshold leakage current through the read transistor 656 and accounts for the standby power of the memory cells 3T (330, 340), 2T1D (310, 320), 3T1D (350, 360) when the cells at a certain row address(es) are not active, and the read bit lines (BLr) are still active (at a high level). As the read transistor 656 can be assigned a low Vt for increased read speed, the Ioff_rg current can be limited by assigning a high Vt for the read select transistor 654.

Retention Time

After the cell 600 is written via the write access transistor 652 and the write access transistor 652 is turned off, charge begins to leak out, reducing the stored voltage (Vc) in the cell. In order to meet the retention time requirement, the sub-threshold OFF current (Ioff_wg 601) through the write access transistor 652 has to be below a certain threshold. The write access transistor 652 is assumed to have a sufficiently high threshold voltage (Vt) and/or gate negative bias, as the sub-threshold leakage current typically decreases by about 10 times for every 0.1V increase in Vt. Also, the gate dielectric thickness has to be above a certain thickness so that the gate leakage current Igd_wg 602 and the junction leakage current Idb_wg 603 through the write access transistor 652 can be kept below a certain level. In the case of the 2T1D, 3T1D memory cells 310, 320, 350, 360 (FIGS. 3D and 3E), the gate dielectric thickness of the read device 656 and the gated diode 658 has to be thick enough to keep the gate tunneling currents Igs_rg 606, Igd_rg 607, Ig_rg 608, Igs_gd 604 and Ig_gd 605 low. Similarly, for the 3T memory cell 330, 340 (FIG. 3B), although there is no gated diode and currents Igs_gd and Ig_gd, the gate dielectric thickness of the read device 656 has to be thick enough to keep the gate tunneling currents Igs_rg 606, Igd_rg 607, and Ig_rg 608 low. The sum of the leakage currents (I_leak) is given by $$I\_leak = Ioff\_wg + Igd\_wg + Idb\_wg + Ig\_rg + Igs\_rg + Igd\_rg + Ig\_gd + Igs\_gd \qquad (4)$$

where $$dQ\_leak = I\_leak\, dt = -C\_cell\, dVc \qquad (5)$$

and $$dt = -C\_cell\, dVc/I\_leak. \qquad (6)$$

Integrating from Vcmin to Vcmax (decaying from Vcmax to Vcmin) gives the retention time, $$Tretention(Vc\max, Vc\min) = \int_{Vcmin}^{Vcmax} \frac{C\_cell}{I\_leak(Vc)} dVc \qquad (7)$$

where C_cell is the cell storage capacitance, Vc is the cell voltage, Vc_max is the initial stored cell voltage, Vc_min is the minimum cell voltage to operate the cell at a given frequency (which determines the maximum time allocated to discharge the bit line in order to read the cell), and Q_leak is the charge leaked from the C_cell.

Figure 6B:
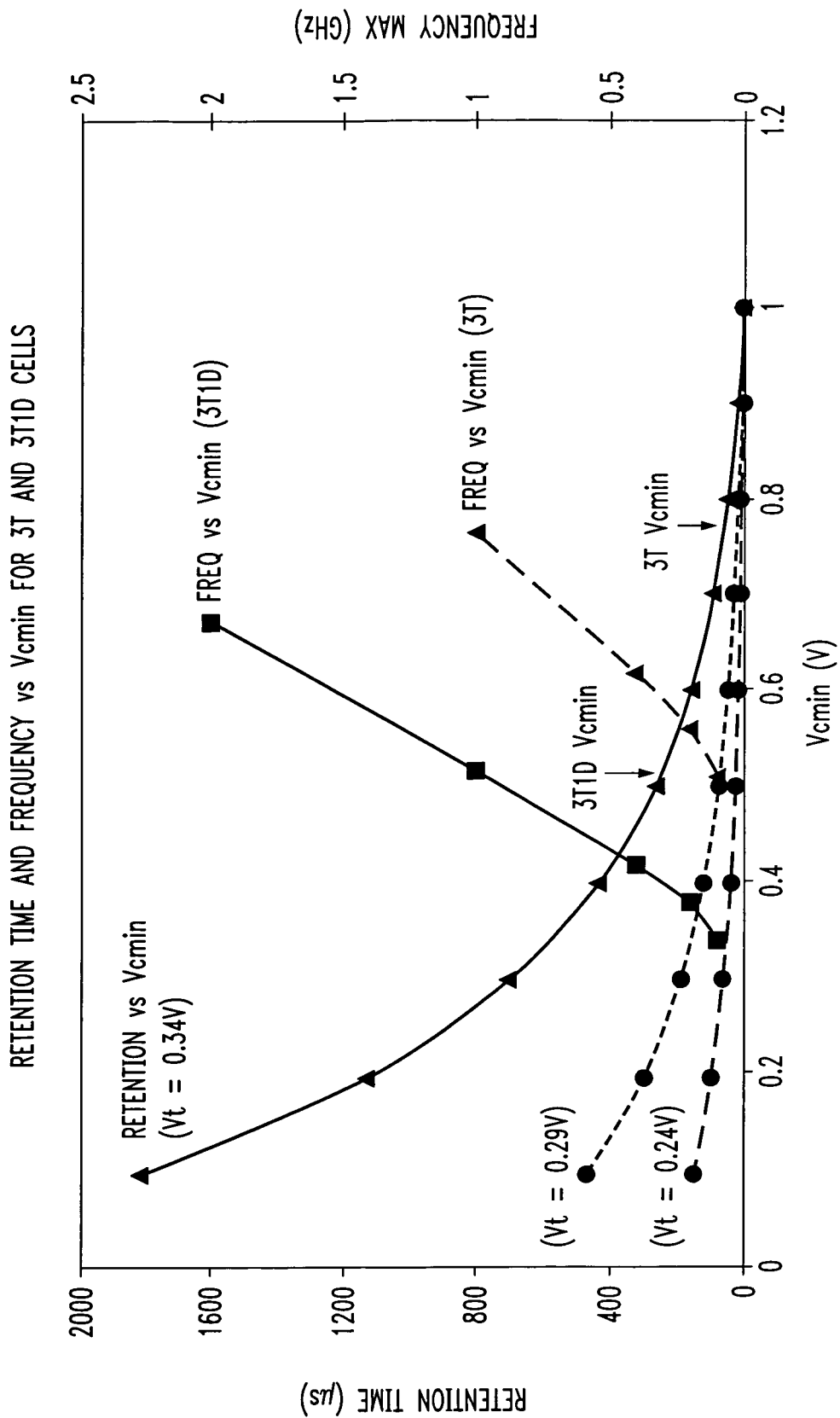
FIG. 6B shows exemplary graphs of retention time vs Vcmin characteristics and frequency vs Vcmin characteristics for 3T and 3T1D memory cells.

FIG. 6B shows exemplary graphs of retention time vs Vcmin characteristics and frequency vs Vcmin characteristics for 3T and 3T1D memory cells. For a given cell storage capacitance (C_cell), leakage currents (giving the total leakage current I_leak), and initial cell voltage (Vc_max), the retention time vs Vcmin characteristic can be obtained by using equations (5)-(7). In FIG. 6B, three exemplary retention time vs Vcmin graphs are shown based on three exemplary threshold voltages of the write access transistor WAT, at 25 C, 1V bit line voltage (VBLH). As shown in FIG. 6B, a higher threshold voltage results in a lower sub-threshold leakage current through the write access transistor WAT and, therefore, a longer retention time (for a given Vcmin value). As shown also in FIG. 6B, for a given memory cell and initial stored cell voltage, a lower Vcmin results in a longer retention time, as there is more time allowed for the charge to leak to that voltage level. A higher Vcmin value also provides for a higher read frequency, as the cell voltage Vc (in the case of the 3T memory cell) or its boosted voltage (in the case of the 2T1D, 3T1D memory cells) is applied to the gate of the read transistor (rg), and a higher Vcmin gives higher gate overdrive (Vgs−Vt) and, subsequently, higher current through the read transistor (rg) and the read path of the memory cell.

Figure 7:
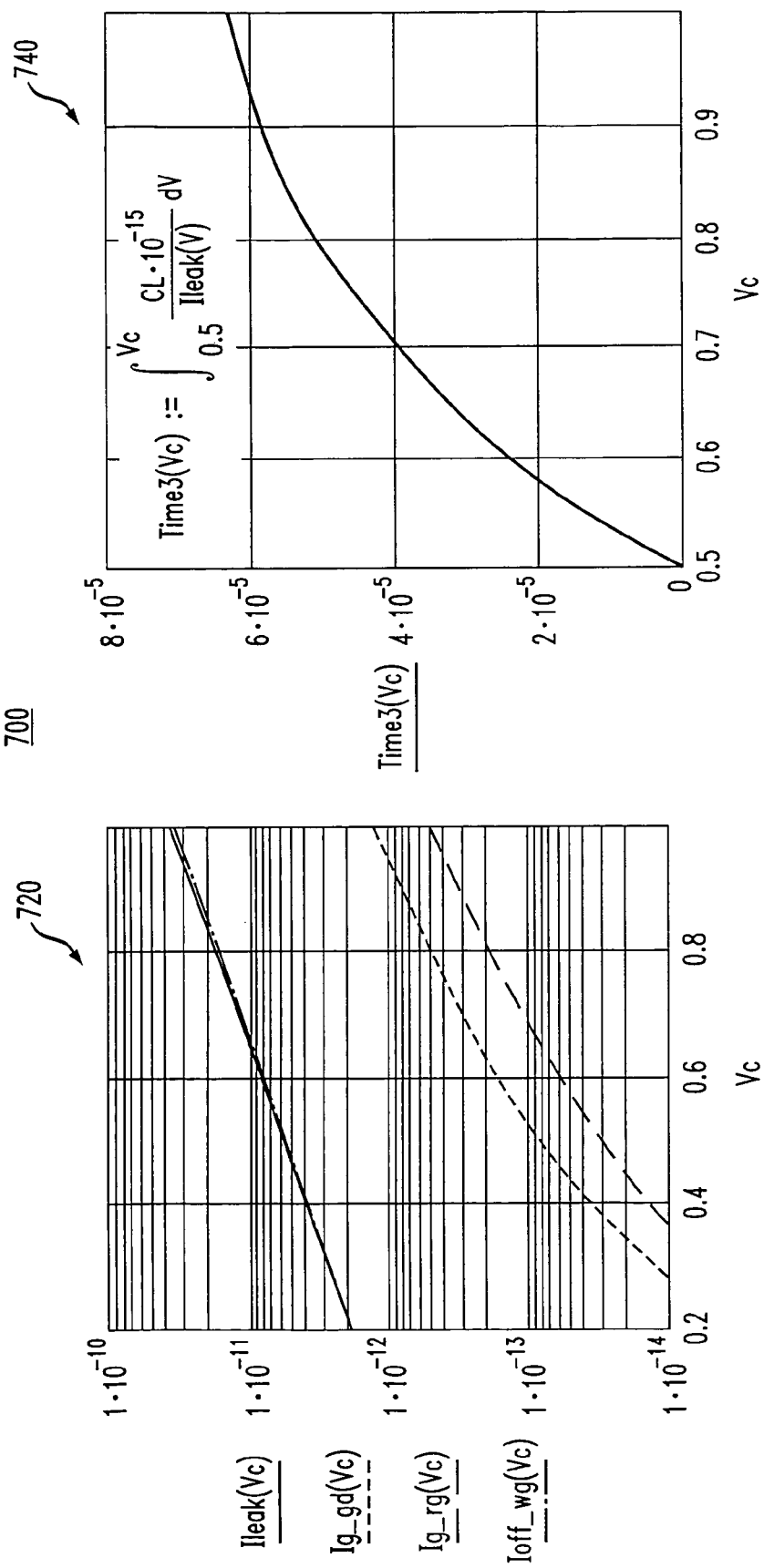
FIG. 7 shows the various leakage currents Ioff_wg, Ig_rg, and Ig_gd versus the cell stored voltage Vc.

FIG. 7 shows some of the various leakage currents of Ioff_wg 601, Ig_rg 608, and Ig_gd 605 versus the voltage Vc stored in the cell. The sum of substantially all the leakage currents is Ileak (as illustrated by equation (4)). The exemplary operating condition is 85 degrees C., and the write transistor 652 has a threshold voltage of 0.39 V with zero word line bias. The right hand side graph 740 gives the retention time of different initial stored voltages Vc (same as Vcmax) when the sense amplifier allows the cell voltage to drop to a Vcmin of 0.5 V which corresponds to a particular read frequency that depends on the particular design, as would be appreciated by a skilled artisan. For example, when storing a 1.0 V level in the cell and allowing the cell voltage threshold to be 0.5 V, the retention time is about 62 µs at 85 degrees C.

Figure 8A:
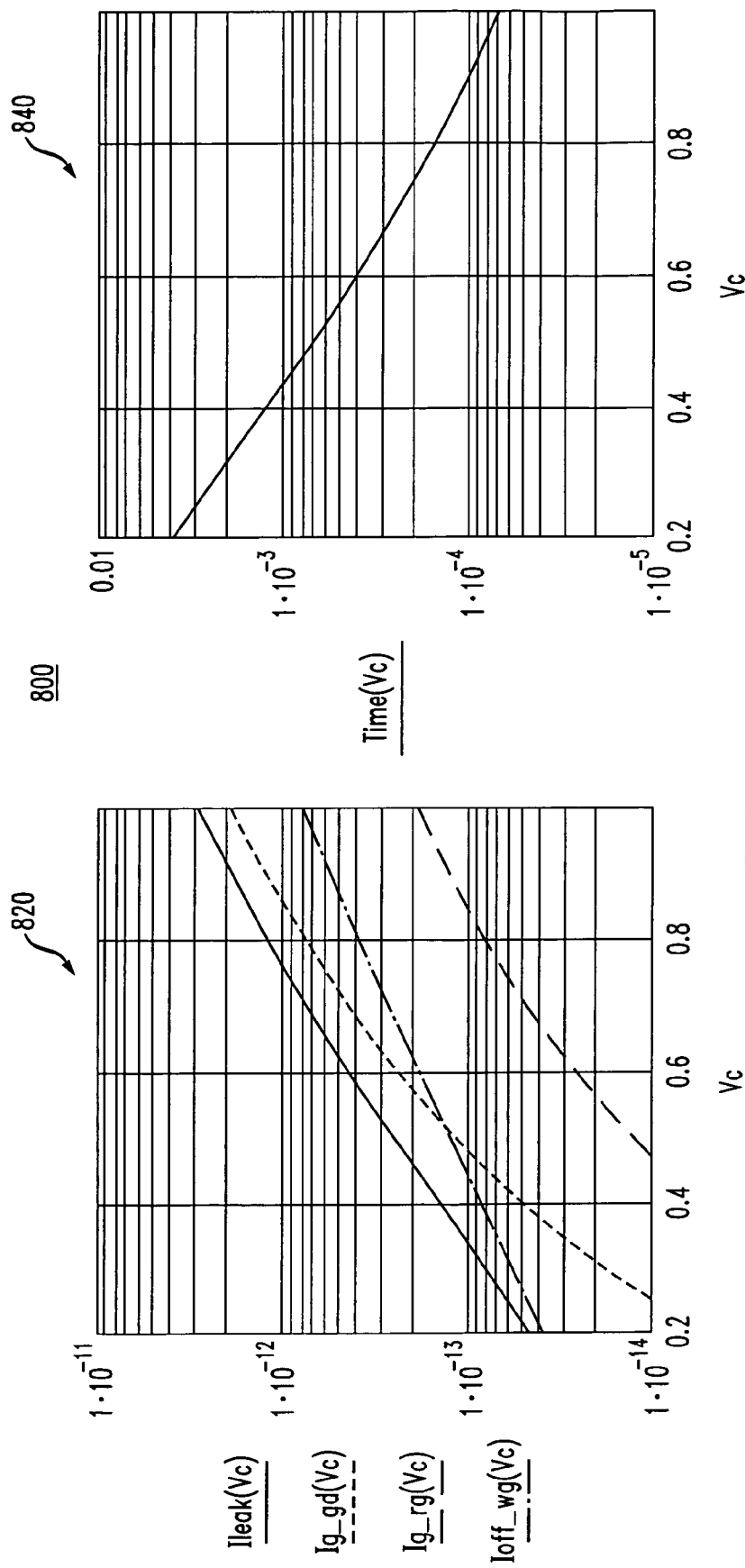
FIGS. 8A and 8B are charts showing exemplary leakage currents vs cell voltage characteristics and exemplary retention time vs cell voltage characteristics of two 3T1D memory cells with different gate oxide thicknesses.

FIG. 8A shows an exemplary leakage currents vs cell voltage characteristic and an exemplary retention time vs cell voltage characteristic of a 3T1D memory cell 350, 360 at 85 degrees C. using a polysilicon gate electrode and silicon dioxide dielectric thickness of 22 Å, a Vt of 0.3 V, and a negative gate voltage bias of −0.4V on the write access transistor 652. The right hand side graph 840 gives the retention time for different initial cell stored voltages (Vcmax) for a sense amplifier operating at a certain frequency that allows only a 100 mV cell voltage drop. For example, when storing a 0.6 V level in the cell, the retention time measured for an allowed Vc drop to 0.5 V is about 400 µs.

Figure 8B:
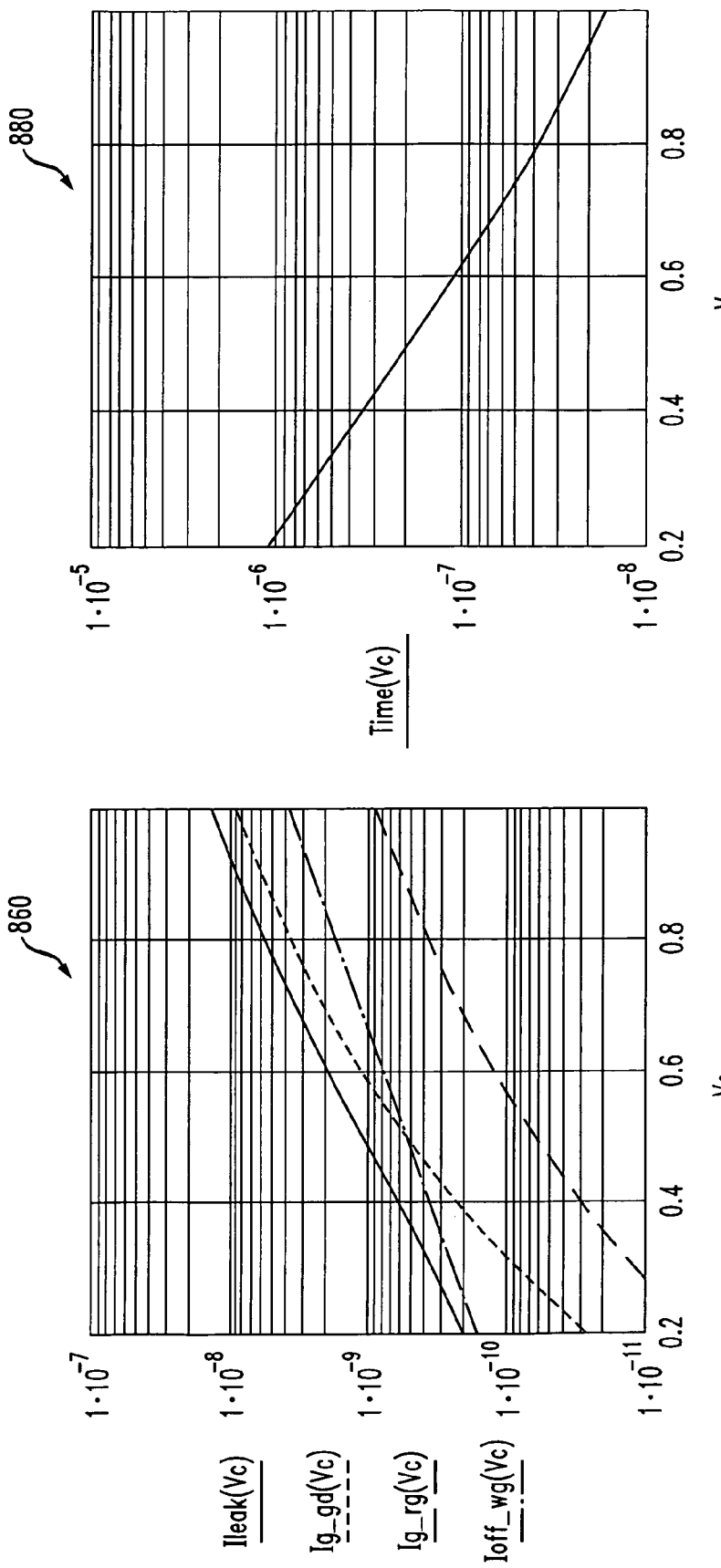

FIG. 8B shows an exemplary leakage currents vs cell voltage characteristic and an exemplary retention time vs cell voltage characteristic of a 3T1D cell 350, 360 at 85 degrees C. using a polysilicon gate electrode and silicon dioxide dielectric thickness of 13.5 Å, a Vt of 0.3 V, and no negative gate voltage bias (0 V) on the write access transistor 652. The right hand-side graph 880 gives the retention time of different initial cell stored voltages (Vcmax) when the sense amplifier is operating at a certain frequency and allows only a 100 mV cell voltage drop. For example, when storing a 0.6 V level to the cell, the retention time measured at an allowed Vc drop to 0.5 V is only about 0.1 µs (3+ orders of magnitude lower than the 400 µs of FIG. 8A). This shows the significant impact of gate dielectric thickness and sub-threshold leakage current on retention time. When the gate dielectric thickness was reduced from 22 Å (FIG. 8A) to 13.5 Å (FIG. 8B), at 0.6V Vc, the Ig_rg gate leakage current 608 of the read transistor 656 was increased from $2.5 \times 10^{-14}$ A to $1 \times 10^{-10}$ A (3+ orders of magnitude), and the Ig_gd gate leakage current 605 of the gated diode (gd) 658 was increased from $2.5 \times 10^{-13}$ A to $1 \times 10^{-9}$ A (3+ orders of magnitude). Without the negative gate bias (Vgs of 0 V instead of −0.4 V) on the write access transistor 652, the sub-threshold leakage current was increased from $2 \times 10^{-13}$ A to $8 \times 10^{-10}$ A (3+ orders of magnitude).

From the two operating conditions illustrated in FIGS. 8A and 8B, it is shown that, in order to meet a certain retention time requirement, the various gate leakages, junction leakages and sub-threshold leakages have to be low enough, the gate dielectric thickness has to be above a certain value, and the threshold voltage of the write access transistor 652 has to be above a certain value, and sufficient negative gate bias on the gate of the write access transistor 652 must exist if the threshold voltage is not sufficiently large.

Gate Leakage

Illustratively, the gate to channel leakage current per unit gate area in a typical technology is found to fit the following empirical.

$$Jgc(Toxgl, Vgs) = 0.0472 \cdot 10^{-4.32 \cdot Toxgl} \cdot 9 \cdot 10^{-5} \cdot \left(e^{16.54 \cdot \frac{Vgs}{Vgs+0.776}} - 1\right) \quad (8)$$

where Toxgl is the gate dielectric thickness for gate leakage calculation, and Vgs is the gate to source voltage. The gate to channel leakage current is sensitive to the gate dielectric thickness, and it increases exponentially as thickness decreases. If Toxgl is below a certain value (e.g., 18 Å), the gate tunneling leakage current through the dielectric to the channel would increase to a level where the charge stored in a memory cell (node Vc) would leak through the gates to which the storage node (Vc) is connected in a very short period of time.

For technology with lithography dimensions less than 130 nm, it is not possible to keep the gate dielectric thickness above 20 Å and to shrink its gate dimensions (e.g., channel length below 120 nm) due to the short channel effect in conventional transistors based on polysilicon gate and silicon dioxide dielectric material gate stacks. This results in larger and larger cell size relative to logic devices as the lithography shrinks.

High-K Dielectric and Gate Thickness

In the metal gate electrode, high-K dielectric memory cell, one can designate the dielectric constant be K*K0, where K0 is the free space dielectric constant. Typically, K=15–20 for a high-K dielectric, whereas for silicon dioxide, K_SiO2=3.9. For the same gate dimension compared to that of a silicon dioxide gate, the induced surface electric field and inversion charge density (when Vgs>Vt) are increased by about a factor of K/K_SiO2. Even with increasing thickness for high-K gate dielectric, the effective gate dielectric thickness (Tox_hiK) can decrease and the capacitance (Cox_hiK) can increase, resulting in a higher induced surface field, a higher ON current per unit channel width, and less short channel effect. The ratio of gate dielectric capacitance between high-K and silicon dioxide is given by $$Cox\_hiK/Cox\_SiO2 = (K/K\_SiO2)(T\_SiO2/T\_hiK). \quad (9)$$

For example, if the physical thickness Tph_SiO2 is 10 Å, the channel inversion layer amounts to an equivalent oxide thickness of 4 Å, and the polysilicon gate depletion amounts to an equivalent oxide thickness of 4 Å, T_SiO2 will equal 18 Å. To obtain a 50% higher Cox using high-K compared to silicon dioxide (assuming K=15), $$Cox\_hiK/Cox\_SiO2 = 1.5 = (15/3.9)(18/T\_hiK),$$
$$\text{wherein } T\_hiK \sim 46 \text{ Å}. \quad (10)$$

As there is negligible depletion depth on the metal gate electrode, and the channel inversion layer amounts to an equivalent high-K thickness of $4 \times (15/3.9) = 15$ Å, the physical thickness Tph_hiK for high-K (with K=15) is about 31 Å. This larger amount of physical thickness, compared to the 10 Å for a polysilicon and silicon dioxide gate stack, substantially reduces the gate leakage current while reducing the short channel effect, keeping the same or higher gate field, and higher ON current. The effective Tox_hiK equals T_SiO2/1.5, wherein T_SiO2=18 Å, and Tox_hiK=12 Å.

Although a high-K dielectric has a lower tunneling barrier, overall, due to the much larger physical thickness, it has an equivalent thickness for gate leakage (Toxgl) that is still much larger than that of the regular thin silicon dioxide gate and, hence, is lower in gate tunneling current. For example, Toxgl_hiK can be 18-20 Å for a high-K dielectric and metal gate stack with an equivalent oxide thickness of 12-14 Å, as compared to a Toxgl_SiO2 of 10 Å for a silicon dioxide and polysilicon gate stack with an equivalent oxide thickness of 18 Å.

Due to the higher dielectric constant with a much larger physical gate dielectric thickness, a high-K gate stack can induce a larger surface electric field. This enables the use of a higher gate dielectric thickness to reduce gate leakage current while keeping the ON current higher and the channel dimension scalable for further technology shrinkages.

Compared to the thick oxide transistors (e.g., 22 Å Toxgl) using a polysilicon and silicon dioxide gate stack, the high-K dielectric gate gives a much higher gate capacitance, a higher induced surface electric field in the silicon, a higher ON current, and allows a much shorter channel length (i.e., smaller cell size) for about the same gate leakage. Compared to the conventional thinner oxide transistors (e.g., 10 Å Toxgl) using a polysilicon and silicon dioxide gate stack, the high-K gate provides a similar or higher gate capacitance (50% more in the above example), a similar or higher induced surface field, a similar or higher ON current, and a substantially lower gate leakage current. An exemplary comparison of certain design parameters between an exemplary high-K dielectric, metal gate electrode memory cells and conventional polysilicon gate electrode, silicon dioxide dielectric gate memory cells is summarized in Table 1.

TABLE 1

|  | Thin, Polysilicon, Silicon Dioxide Gate Stack | Thick, Polysilicon Silicon Dioxide Gate Stack | Metal Gate, High-K, Gate Stack |
|---|---|---|---|
| Dielectric Constant | 3.9 | 3.9 | 15 |
| Channel Length | 60 nm | 120 nm | 60 nm |
| Physical Insulator Thickness | 10 Å | 22 Å | 31 Å |
| Equivalent Tox (including gate depletion and inversion layer thickness effect) | 18 Å | 30 Å | 12 Å |
| Equivalent Cox per area | 100% | 60% | 150% |
| Gate Leakage Thickness | 10 Å | 22 Å | 20 Å |
| ON Current per W/L | 100% | 60% | 150% |

Sub-Threshold OFF Current Leakage

Illustratively, the source to drain sub-threshold OFF current per unit width of a transistor in a typical technology can be written as, $$Joff(Vgs, Vds, Vt, T, L) = \frac{3 \cdot 10^{-7}}{L} \cdot 10^{\frac{Vgs - [Vt + 0.2 \cdot (1 - Vds) - 0.0007 \cdot (T - 300)]}{0.1 \cdot \frac{T}{300}}} \quad (11)$$

where L is the channel length, T is the temperature in K, Vgs is the gate to source voltage, Vds is the drain to source voltage, and Vt is the threshold voltage. The sub-threshold OFF current is sensitive to the threshold voltage and Vgs. It increases exponentially as the threshold voltage decreases, and decreases exponentially as Vgs decreases, at a rate of about a decade per 100 mV at room temperature in the above example. As the quarter- to mid-gap work function of a metal gate electrode in a high-K dielectric, metal gate electrode, silicon gate stack provides a higher threshold voltage (Vt; typically about 0.25-0.5 V higher than the polysilicon gate electrode and silicon dioxide gate stack), the sub-threshold OFF current via the write access transistor 652 would then be reduced by 2.5-5 orders of magnitude for the same operating write access transistor 652 voltages and stored cell voltage. In order to increase the threshold voltage in a polysilicon gate electrode, silicon dioxide dielectric, silicon gate stack, heavy doping would be needed as the polysilicon gate electrode does not have as large a work function as the metal gate electrode. Due to the side effect of heavy doping on (band to band) junction leakage and dopant variation, however, it may not be possible to attain the threshold level of a metal gate electrode gate stack by increasing the doping concentration alone.

It is also not desirable, in regards to the cost of manufacturing, if different metals have to be used to provide the proper work function and threshold voltage to implement both NFET and PFET for complementary logic. In the case of the exemplary memory cell embodiments 1T1C 305, 3T 330, 340, 1T1D 370, 2T1D 310, 320, and 3T1D 350, 360, which consist of only NFET transistors, only a single type of metal gate electrode suffices. It will be understood that memory cells with only PFET transistors can be employed and that a single type of metal gate electrode can be employed. A type of metal gate electrode which provides about 0.2-0.25 V increase in Vt for the write access transistor 652 would reduce the OFF current by about two orders of magnitude, compared to the memory cells 100 based on the polysilicon gate electrode and silicon dioxide gate stack. The choice of the Vt is a tradeoff between the sub-threshold OFF current, the retention time, and the write speed, and also the level of word line boosting voltage needed to effectively write to the cells. Too high a Vt would require a high level of word line boosting voltage which may pose issues related to gate dielectric breakdown voltage. A Vt of 0.25 V is a good tradeoff in regard to the above factors.

The higher Vt provided by the metal gate electrode used in the read select transistor (rs) 334, 344, 354, 364 for the 3T and 3T1D memory cells 330, 340, 350, 360 is also beneficial for reducing the standby power of the memory arrays. The read select transistor 334, 344, 354, 364 is OFF for the cells that are not active or selected for a read operation, while the read bit line may be at a high (precharged) voltage. The higher Vt of the read select transistors 334, 344, 354, 364 further limits the OFF current through the read paths, hence substantially reducing the standby power compared to the memory cells that are based on the polysilicon gate electrode, silicon dioxide gate stack.

The read transistors (rg) 336, 346, 356, 366 for the 3T 330, 340, 2T1D 310, 320 and 3T1D 350, 360 memory cells require a relatively low Vt to deliver high read current to discharge the bit line in a short period of time. The ¼-gap metal gate electrode combined with a slightly reduced channel doping can deliver threshold voltages similar to the polysilicon gate devices and still maintain good short channel control. In contrast, the ½-gap metal gate electrode transistors would require too much of a reduction of the channel doping, which will negatively impact the short channel control and limit the minimum channel length. Overall, the ¼-gap metal gate electrode, high-K dielectric gate stack combination can provide one or more of high retention time, fast read speed, and small cell area. It will be understood that a gate stack comprising a high-K dielectric with a metal gate electrode that has a lower work function or with a gate electrode that differs from that of the write transistor can alternatively be employed for the read transistors to attain a lower Vt and higher read speed.

Memory cells according to one or more aspects of the present invention may be formed into memory circuits, which may be realized as integrated circuits; thus, at least a portion of the techniques of one or more aspects or embodiments of the present invention described herein may be implemented in an integrated circuit.

Figure 9:
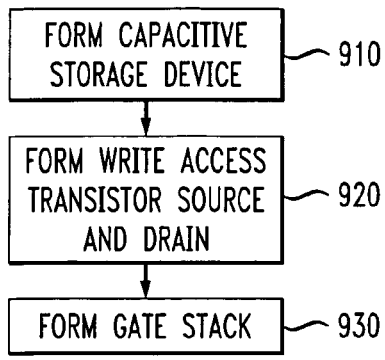
FIG. 9 is a flow chart for a method of manufacturing an exemplary dynamic random access memory cell incorporating a gate stack comprising high-K dielectric.

FIG. 9 is a flow chart for a method of manufacturing an exemplary dynamic random access memory cell (e.g., as described herein) incorporating a gate stack comprising a high-K dielectric. The capacitive storage device is formed in step 910, the drain and source of the write access transistor are formed in step 920, and the gate stack is formed in step 930. It will be appreciated that, given the teachings herein, the steps can be performed in any appropriate order and any desired degree of overlap. The method of manufacturing an exemplary dynamic random access memory cell may optionally include the formation of a capacitive storage device comprising a high-K dielectric. The formation of a capacitive storage device comprising a high-K dielectric step further comprises the step of forming a high-K dielectric with a higher dielectric constant than that of silicon dioxide. If the capacitive storage device is a gated diode with a high-K dielectric gate stack, the method of manufacturing includes the steps of forming a source of the gated diode and forming a gate stack for the gate diode, wherein the formation of the gate stack further comprises the step of forming a high-K dielectric with a higher dielectric constant than that of silicon dioxide. The gate stack may optionally comprise a metal electrode, wherein the forming of a gate stack with a high-K dielectric step further comprises the step of forming a metal electrode with an interface to the high-K dielectric.

Circuits including memory cells as described above can be part of the design for an integrated circuit chip. The chip design can be created, for example, in a graphical computer programming language, and stored in a computer storage medium (such as a disk, tape, physical hard drive, optical disc storage (e.g. CDROM, DVD), or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design can then be converted into an appropriate format such as, for example, Graphic Design System II (GDSII), for the fabrication of photolithographic masks, which typically include multiple copies of the chip design in question that are to be formed on a wafer. The photolithographic masks can be utilized to define areas of the wafer (and/or the layers thereon) to be etched or otherwise processed. The method as described above can be used in the fabrication of integrated circuit chips.

Resulting integrated circuit chips can be distributed by the fabricator in raw wafer form (that is, as a single wafer that has multiple unpackaged chips), as a bare die or in a packaged form. In the latter case, the chip can be mounted in a single chip package (such as a plastic carrier, with leads that are affixed to a mother board or other higher level carrier) or in a multi-chip package (such as a ceramic carrier that has either or both surface interconnections or buried interconnections). In any case, the chip may then be integrated with other chips, discrete circuit elements and/or other signal processing devices as part of either (a) an intermediate product, such as a mother board, or (b) an end product. The end product can be any product that includes integrated circuit chips, ranging from toys and other low-end applications to advanced computer products having a display, a keyboard or other input device, memory, and a central processor.

The memory cells and techniques of the present invention can be used for stand-alone memory subsystems in computer systems, and the memory cells and techniques of the present invention can be used for the different level of (high speed) caches embedded in (high speed) processors with a single or multiple cores. A processor can be a general purpose microprossor, a general purpose central processor, a network processor, a graphic processor, etc. The memory cells and techniques of the present invention can also be used for low power memory subsystems and/or embedded cache memories in low power processors used in hand-held computing devices and mobile devices such as cell-phones.

One or more exemplary embodiments of the present invention may exhibit one or more of high speed, low power, and small footprint that make them suitable for, e.g., high speed caches embedded in high speed processor chips, such as general purpose microprocessor chips, general purpose central processor chips, graphic processor chips, and network processor chips.

Figure 10:
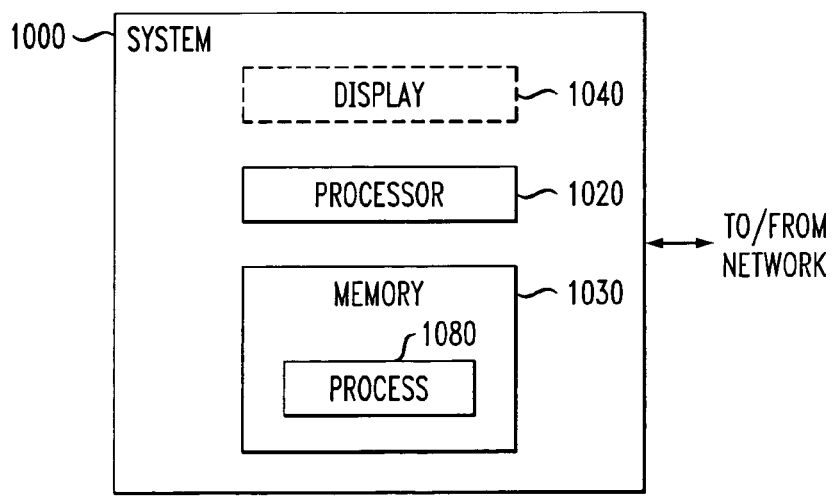
FIG. 10 is a block diagram of a computer system 1000 that can employ dynamic random access memory cells using techniques of the present invention.

FIG. 10 is a block diagram of a computer system 1000 that can employ dynamic random access memory cells and memories using techniques of the present invention. As shown in FIG. 10, memory 1030 configures the processor 1020 to implement methods, steps, and functions (collectively, shown as process(es) 1080 in FIG. 10, and the subdivisions known as threads). The memory 1030 could be distributed or local and the processor 1020 could be distributed or singular. The memory 1030 could be implemented as an electrical, magnetic or optical memory, or any combination of these or other types of storage devices. It should be noted that each distributed processor that makes up processor 1020 generally contains its own addressable memory space. It should also be noted that some or all of computer system 1000 can be incorporated into an application-specific or general-use integrated circuit. Thus, the present invention contemplates a computing apparatus having a memory, an input output device (display 1040 is representative of a wide variety of such devices including but not limited to mice, keyboards, and the like), and at least one processor coupled to the memory and the input output device and operative to process information. At least some of the information can be stored in the memory. The memory can be a dynamic memory array according to one or more embodiments of the present invention. Dynamic memory arrays according to the present invention may be one of the memories in system 1000. Further, the dynamic memory arrays according to the present invention may be embedded in one or more processor(s) 1020 of the system 1000, typically functioning as cache memory in the various levels of the memory hierarchy of the system. A ROM may store permanent information, such as for "booting up," while a Random Access Memory (RAM) may be provided for executing application programs, and disks or other memories may also be employed.

Figure 11:
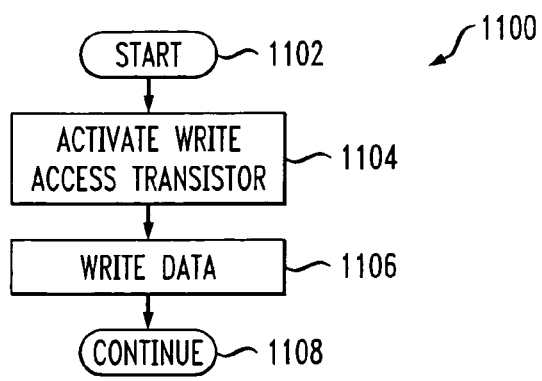
FIG. 11 is a flow chart for an exemplary method of storing data according to one aspect of the invention.

FIG. 11 depicts an exemplary method 1100 for storing data in a dynamic random access memory cell. After beginning at step 1102, the method includes the steps of activating a write access transistor, wherein the write access transistor is operatively coupled to a capacitive storage device and has a gate stack comprising a high-K gate dielectric, as at step 1104; and writing the data to the capacitive storage device via the write access transistor, as at step 1106. The method continues at step 1108. Reading data, and other operations, can be carried out in an analogous fashion, which will be apparent to the skilled artisan from the teachings herein.

It will be appreciated and should be understood that the exemplary embodiments of the invention described above can be implemented in a number of different fashions. Given the teachings of the invention provided herein, one of ordinary skill in the related art will be able to contemplate other implementations of the invention.

What is claimed is:

1. A dynamic random access memory cell, comprising:
a capacitive storage device comprising a gated diode having a capacitive storage gate stack, said capacitive storage gate stack comprising a capacitive storage gate stack high-K dielectric, wherein said capacitive storage gate stack high-K dielectric has a dielectric constant greater than the dielectric constant of silicon dioxide;
a write access transistor, said write access transistor being operatively coupled to said capacitive storage device and having a write access transistor gate stack, said write access transistor gate stack comprising a write access transistor gate stack high-K dielectric, wherein said write access transistor gate stack high-K dielectric has a dielectric constant greater than a dielectric constant of silicon dioxide, and wherein said write access transistor gate stack further comprises a metal gate electrode coupled to said write access transistor gate stack high-K dielectric, and wherein said metal gate electrode substantially exhibits a ¼ gap work function; and a read transistor, said read transistor being operatively coupled to said capacitive storage device and having a read transistor gate stack, said read transistor gate stack comprising a read transistor gate stack high-K dielectric, wherein said read transistor gate stack high-K dielectric has a dielectric constant greater than said dielectric constant of silicon dioxide.

2. The dynamic random access memory cell of claim 1, wherein said read transistor gate stack further comprises a metal gate electrode coupled to said read transistor gate stack high-K dielectric, and said metal gate electrode of said read transistor substantially exhibits a band edge work function.

3. The dynamic random access memory cell of claim 1, wherein said write access transistor gate stack is configured for application of a negative voltage.

4. The dynamic random access memory cell of claim 1, wherein said capacitive storage device comprises a high-K dielectric.

5. The dynamic random access memory cell of claim 1, wherein:
said write access transistor gate stack high-K gate dielectric has an equivalent electrical thickness (Tox) associated with a gate capacitance per unit area;
said equivalent electrical thickness (Tox) is no greater than an equivalent electrical thickness (Tox) of a gate stack comprising a polysilicon gate electrode and a silicon dioxide dielectric;
said gate capacitance per unit area is no less than a gate capacitance per unit area of a gate stack comprising a polysilicon gate electrode and a silicon dioxide dielectric; and
wherein a channel length of said write access transistor gate stack comprising said write access transistor gate stack high-K dielectric is substantially the same as a channel length of said gate stack comprising said polysilicon gate electrode and said silicon dioxide dielectric.

6. The dynamic random access memory cell of claim 1, wherein:
said write access transistor gate stack high K high-K gate dielectric has a physical dielectric thickness associated with a gate leakage per unit area;
said physical dielectric thickness is no less than a physical dielectric thickness of a gate stack comprising a polysilicon gate electrode and a silicon dioxide dielectric;
said gate leakage per unit area is no greater than a gate leakage per unit area of a gate stack comprising a polysilicon gate electrode and a silicon dioxide dielectric; and
wherein a channel length of said write access transistor gate stack comprising said write access transistor gate stack high-K dielectric is substantially the same as a channel length of said write access transistor gate stack comprising said polysilicon gate electrode and said silicon dioxide dielectric.

7. The dynamic random access memory cell of claim 1, wherein said metal gate electrode provides a higher threshold voltage for said write access transistor than a polysilicon gate electrode for a substantially same level of silicon substrate doping concentration.

8. The dynamic random access memory cell of claim 7, wherein said metal gate electrode is selected to decrease a sub-threshold leakage of said write access transistor and increase a retention time of said dynamic random access memory cell.

9. The dynamic random access memory cell of claim 7, wherein said metal gate electrode is selected to eliminate a polysilicon depletion effect that reduces an equivalent electrical thickness (Tox) of said write access transistor gate stack in comparison to a polysilicon gate electrode and a silicon dioxide dielectric gate stack.

10. The dynamic random access memory cell of claim 7, wherein said write access transistor has a threshold voltage, and wherein said threshold voltage is selected based on at least one of the following: a sub-threshold off current, a retention time, and a write speed.

11. The dynamic random access memory cell of claim 7, wherein said metal gate electrode provides a work function between about 4.0 eV and about 5.2 eV.

12. The dynamic random access memory cell of claim 1, wherein a threshold voltage of said write access transistor is greater than a threshold voltage of said read transistor.

13. The dynamic random access memory cell of claim 1, wherein said read transistor gate stack further comprises a metal gate electrode coupled to said read transistor gate stack high-K dielectric, wherein said metal gate electrode of said read transistor substantially exhibits a work function which is less than a ¼-gap work function.

14. A memory array, comprising:
a plurality of bit line structures, each of said bit line structures comprising at least one bit line;
a plurality of word line structures, each of said word line structures comprising at least one word line and wherein said word line structures intersect with said bit line structures at a plurality of sites;
one or more dynamic random access memory cells, wherein each of said one or more dynamic random access memory cells is operatively coupled to at least one of said plurality of bit line structures and at least one of said plurality of word line structures and wherein each of said one or more dynamic random access memory cells comprises:
a capacitive storage device comprising a gated diode having a capacitive storage gate stack, said capacitive storage gate stack comprising a capacitive storage gate stack high-K dielectric, wherein said capacitive storage gate stack high-K dielectric has a dielectric constant greater than the dielectric constant of silicon dioxide;
a write access transistor, said write access transistor being operatively coupled to said capacitive storage device and having a write access transistor gate stack, said write access transistor gate stack comprising a write access transistor gate stack high-K dielectric, wherein said write access transistor gate stack high-K dielectric has a dielectric constant greater than a dielectric constant of silicon dioxide, and wherein said write access transistor gate stack further comprises a metal gate electrode coupled to said write access transistor gate stack high-K dielectric, and wherein said metal gate electrode substantially exhibits a ¼ gap work function; and
a read transistor, said read transistor being operatively coupled to said capacitive storage device and having a read transistor gate stack, said read transistor gate stack comprising a read transistor gate stack high-K dielectric, wherein said read transistor gate stack high-K dielectric has a dielectric constant greater than said dielectric constant of silicon dioxide.

15. The memory array of claim 14, wherein said memory array is formed as an integrated circuit.

16. The memory array of claim 14, wherein each write access transistor gate stack high-K gate dielectric is selected to reduce at least one of gate leakage current and sub-threshold leakage current.

17. The memory array of claim 14, wherein:
each write access transistor gate stack high-K gate dielectric has an equivalent electrical thickness (Tox) associated with a gate capacitance per unit area;
said equivalent electrical thickness (Tox) is no greater than an equivalent electrical thickness (Tox) of a gate stack comprising a polysilicon gate electrode and a silicon dioxide dielectric; and
said gate capacitance per unit area is no less than a gate capacitance per unit area of a gate stack comprising a polysilicon gate electrode and a silicon dioxide dielectric.

18. The memory array of claim 14, wherein:
each write access transistor gate stack high-K gate dielectric has a physical dielectric thickness associated with a gate leakage per unit area;
said physical dielectric thickness is no less than a physical dielectric thickness of a gate stack comprising a polysilicon gate electrode and a silicon dioxide dielectric; and
said gate leakage per unit area is no greater than a gate leakage per unit area of a gate stack comprising a polysilicon gate electrode and a silicon dioxide dielectric, wherein a channel length of each write access transistor gate stack comprising said write access transistor gate stack high-K dielectric is substantially the same as a channel length of said write access transistor gate stack comprising said polysilicon gate electrode and said silicon dioxide dielectric.

19. The memory array of claim 14, wherein each metal gate electrode provides a higher threshold voltage for each write access transistor than a polysilicon gate electrode for a substantially same level of silicon substrate doping concentration.

20. The memory array of claim 14, wherein each metal gate electrode is selected to eliminate a polysilicon depletion effect that reduces an equivalent electrical thickness (Tox) of each write access transistor gate stack in comparison to a polysilicon gate electrode and a silicon dioxide dielectric gate stack.

21. The memory array of claim 14, wherein a threshold voltage of said write access transistor is greater than a threshold voltage of said read transistor.

* * * * *